US012648121B2

(12) United States Patent
Yang et al.

(10) Patent No.: US 12,648,121 B2
(45) Date of Patent: Jun. 2, 2026

(54) DISPLAY DEVICE

(71) Applicant: LG Display Co., Ltd., Seoul (KR)

(72) Inventors: Eunjeong Yang, Goyang-si (KR);
TaeYoung Jung, Daegu (KR)

(73) Assignee: LG Display Co., Ltd., Seoul (KR)

( * ) Notice: Subject to any disclaimer, the term of this
patent is extended or adjusted under 35
U.S.C. 154(b) by 277 days.

(21) Appl. No.: 18/588,600

(22) Filed: Feb. 27, 2024

(65) Prior Publication Data

US 2024/0292579 A1      Aug. 29, 2024

(30) Foreign Application Priority Data

Feb. 28, 2023    (KR) ......................... 10-2023-0027260

(51) Int. Cl.
H05K 7/20 (2006.01)
(52) U.S. Cl.
CPC ................................ H05K 7/20963 (2013.01)
(58) Field of Classification Search
CPC .................................................. H05K 7/20963
See application file for complete search history.

(56) References Cited

U.S. PATENT DOCUMENTS

| | | | | |
|---|---|---|---|---|
| 7,423,878 B2 * | 9/2008 | Kim | .................... | H05K 7/20963 |
| | | | | 345/905 |
| 7,649,313 B2 * | 1/2010 | Kim | .................... | H05K 7/20963 |
| | | | | 313/46 |
| 9,095,080 B2 * | 7/2015 | Yoon | .................... | H05K 7/20963 |
| 10,517,173 B2 * | 12/2019 | Kim | ......................... | H05K 5/03 |
| 2024/0290930 A1 * | 8/2024 | Yang | .................... | H05K 7/20963 |
| 2024/0290932 A1 * | 8/2024 | Kim | .................... | H10H 20/8583 |
| 2024/0292572 A1 * | 8/2024 | Yang | .................... | H01L 23/367 |

FOREIGN PATENT DOCUMENTS

| | | | | | |
|---|---|---|---|---|---|
| KR | 20050049674 A | * | 5/2005 | | |
| KR | 20050096405 A | * | 10/2005 | ......... | H05K 7/20963 |
| KR | 101486369 B1 | * | 1/2015 | ......... | H05K 7/20963 |
| KR | 20240131577 A | * | 9/2024 | ........... | H10H 29/142 |
| KR | 20240133404 A | * | 9/2024 | ........... | H10H 29/142 |

* cited by examiner

*Primary Examiner* — Robert J Hoffberg
(74) *Attorney, Agent, or Firm* — Morgan, Lewis &
Bockius LLP

(57)      ABSTRACT

A display device may include a display panel; a cover
bottom on a rear surface of the display panel and including
a first opening; a plate bottom on the rear surface of the
display panel and overlapping the first opening; a printed
circuit board on a rear surface of the plate bottom and
connected to the display panel; a plurality of flexible films
connecting the printed circuit board and the display panel;
and a heat dissipation unit disposed between the display
panel and the cover bottom. The heat dissipation unit may
overlap the plurality of flexible films.

20 Claims, 8 Drawing Sheets

DISPLAY DEVICE

CROSS-REFERENCE TO RELATED APPLICATION

This application claims the priority of Korean Patent Application No. 10-2023-0027260, filed on Feb. 28, 2023, in the Korean Intellectual Property Office, the disclosure of which is incorporated herein by reference.

BACKGROUND

Technical Field

The present disclosure relates to a display device and, more particularly, to a display device using a light emitting diode (LED).

Description of the Related Art

Among display devices used for a monitor of a computer, a television, a cellular phone, or the like, there are an organic light emitting display (OLED) device which is a self-emitting device, a liquid crystal display (LCD) device which requires a separate light source, and the like.

As the applicable range of display devices is diversified to personal digital assistants as well as monitors of computers and televisions, a display device with a large display area and reduced volume and weight is being studied.

Further, recently, a display device including a light emitting diode (LED) is attracting attention as a next generation display device. Since the LED is formed of an inorganic material, rather than an organic material, reliability is excellent so that a lifespan thereof is longer than that of the liquid crystal display device or the organic light emitting display device. Further, the LED has a relatively fast lighting speed, excellent luminous efficiency, and a strong impact resistance so that a stability is excellent and an image having a high luminance can be displayed.

SUMMARY

An object to be achieved by the present disclosure is to provide a display device which uniformly implements the overall temperature of a display panel.

Another object to be achieved by the present disclosure is to provide a display device which improves a display quality by reducing a temperature deviation of a display panel.

Still another object to be achieved by the present disclosure is to provide a display device which uniformly disperses heat generated in a printed circuit board to the entire display panel.

Still another object to be achieved by the present disclosure is to provide a display device which minimizes recognizable spots or color differences by reducing a temperature difference between an area in which a printed circuit board is disposed and an area in which the printed circuit board is not disposed.

Objects of the present disclosure are not limited to the above-mentioned objects, and other objects, which are not mentioned above, can be clearly understood by those skilled in the art from the following descriptions.

To achieve these objects and other advantages of the present disclosure, as embodied and broadly described herein, a display device includes: a display panel; a cover bottom on a rear surface of the display panel and including a first opening; a plate bottom on the rear surface of the display panel and overlapping the first opening; a printed circuit board on a rear surface of the plate bottom and connected to the display panel; a plurality of flexible films connecting the printed circuit board and the display panel; and a heat dissipation unit disposed between the display panel and the cover bottom. The heat dissipation unit may overlap the plurality of flexible films. The heat dissipation unit may overlap the plurality of flexible films to uniformly disperse heat generated in the printed circuit board to a cover shield and reduce the overall temperature deviation of the display panel.

In another aspect of the present disclosure, a display device includes: a display panel; a cover bottom on a rear surface of the display panel and including a first opening; a plurality of flexible films, each passing through the first opening and having one end connected to the display panel; and a heat dissipation unit disposed between the display panel and the cover bottom. A front surface of the heat dissipation unit may be in contact with a rear surface of the one end of at least one of the plurality of flexible films.

Other detailed matters of the example embodiments are included in the detailed description and the drawings.

According to the present disclosure, a temperature deviation in the entire area of the display panel may be minimized.

According to the present disclosure, heat generated in the printed circuit board may be dispersed to the entire cover shield so that the concentration of the heat on a partial area of the display panel may be minimized.

According to the present disclosure, recognizable spots or color differences due to the temperature deviation in the display panel may be minimized to improve a display quality.

The effects according to the present disclosure are not limited to the contents exemplified above, and more various effects are included in the present specification.

Additional features and aspects of the disclosure will be set forth in the description that follows and in part will become apparent from the description or may be learned by practice of the inventive concepts provided herein. Other features and aspects of the inventive concepts may be realized and attained by the structure particularly pointed out in, or derivable from, the written description, claims hereof, and the appended drawings.

It is to be understood that both the foregoing general description and the following detailed description of the present disclosure are by way of example and are intended to provide further explanation of the disclosures as claimed.

BRIEF DESCRIPTION OF THE DRAWINGS

The accompanying drawings, which are included to provide a further understanding of the disclosure and are incorporated in and constitute a part of this application, illustrate example embodiments of the disclosure and together with the description serve to explain the principles of the disclosure.

DETAILED DESCRIPTION OF THE EMBODIMENT

Figure 1:
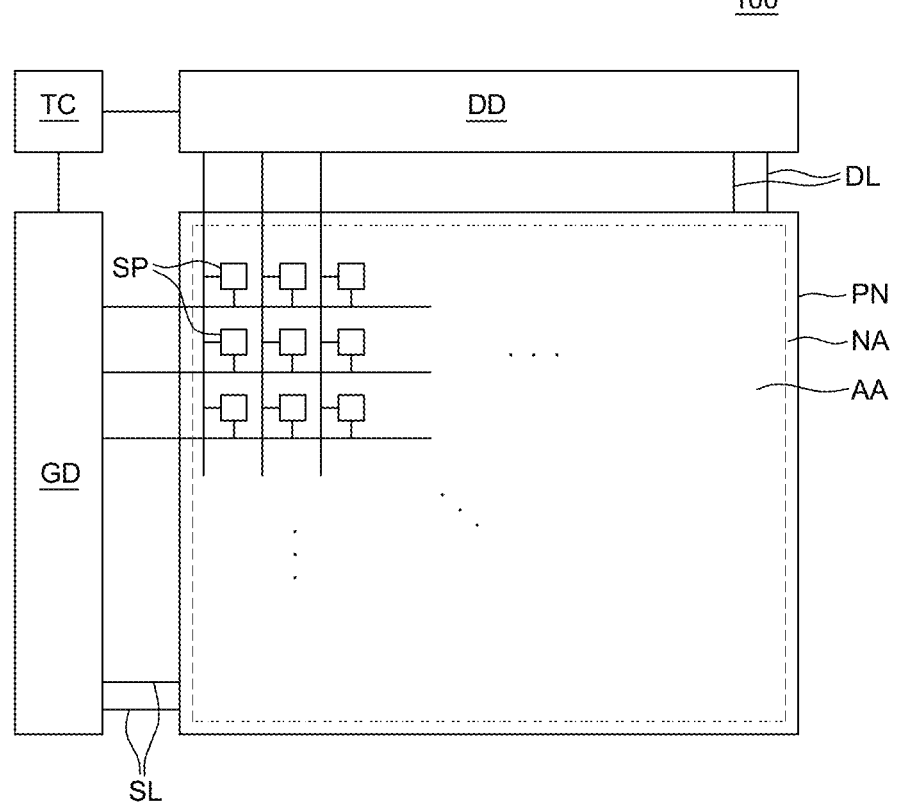
FIG. 1 is a schematic diagram of a display device according to an example embodiment of the present disclosure.

Advantages and features of the present disclosure, and methods of achieving them will become apparent with reference to the example embodiments described below in detail in conjunction with the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

The shapes, dimensions, areas, lengths, thicknesses, ratios, angles, numbers, and the like, which are illustrated in the drawings to describe various example embodiments of the present disclosure, are merely given by way of example. Therefore, the present disclosure is not limited to such illustrated details in the drawings. Like reference numerals generally denote like elements throughout the specification, unless otherwise specified.

In the following description, where a detailed description of a relevant known function or configuration may unnecessarily obscure aspects of the present disclosure, a detailed description of such a known known function or configuration may be omitted or be briefly discussed.

Where a term like "comprise," "have," "include," "contain," "constitute," "made up of," or "formed of" is used, one or more other elements may be added unless it is used with a more limiting term, such as "only" or the like. An element described in the singular form is intended to include a plurality of elements, and vice versa, unless the context clearly indicates otherwise.

In construing an element, the element should be construed as including an error or tolerance range even where no explicit description of such an error or tolerance range is provided.

Where a positional relationship between two elements is described with a term, such as "on," "above," "below," "beneath," and "next," or the like, one or more other elements may be located between the two elements unless the term is used with a more limiting term, such as "direct (ly)."

For example, where a first element is described as being positioned "on" a second element, the first element may be positioned above and contact the second element or may merely be above the second element with one or more additional elements disposed between the first and second elements.

Although the terms "first," "second," and the like may be used herein to describe various elements, these elements should not be interpreted to be limited by these terms as they are not used to define a particular essence, order, sequence, precedence, or number of such elements. These terms are used only to refer one element separately from another. For example, a first element could be termed a second element, and a second element could similarly be termed a first element, without departing from the scope of the present disclosure.

A size and a thickness of each component illustrated in the drawing are illustrated for convenience of description, and the present disclosure is not limited to the specific size or thickness of the component illustrated.

Features of various embodiments of the present disclosure may be partially or wholly coupled to or combined with each other, and may be operated, linked, or driven together in various ways as those skilled in the art can sufficiently understand. The embodiments of the present disclosure may be carried out independently from each other, or may be carried out together in association with each other.

Hereinafter, various detailed example embodiments of the present disclosure will be described with reference to the accompanying drawings.

Figure 2A:
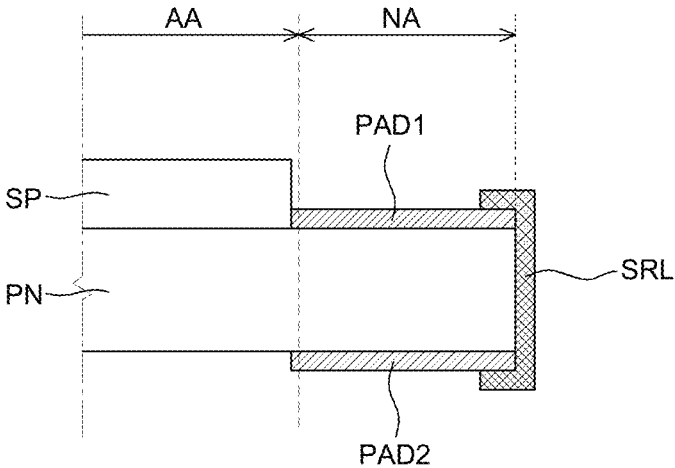
FIG. 2A is a partial cross-sectional view of a display device according to an example embodiment of the present disclosure.
Figure 2B:
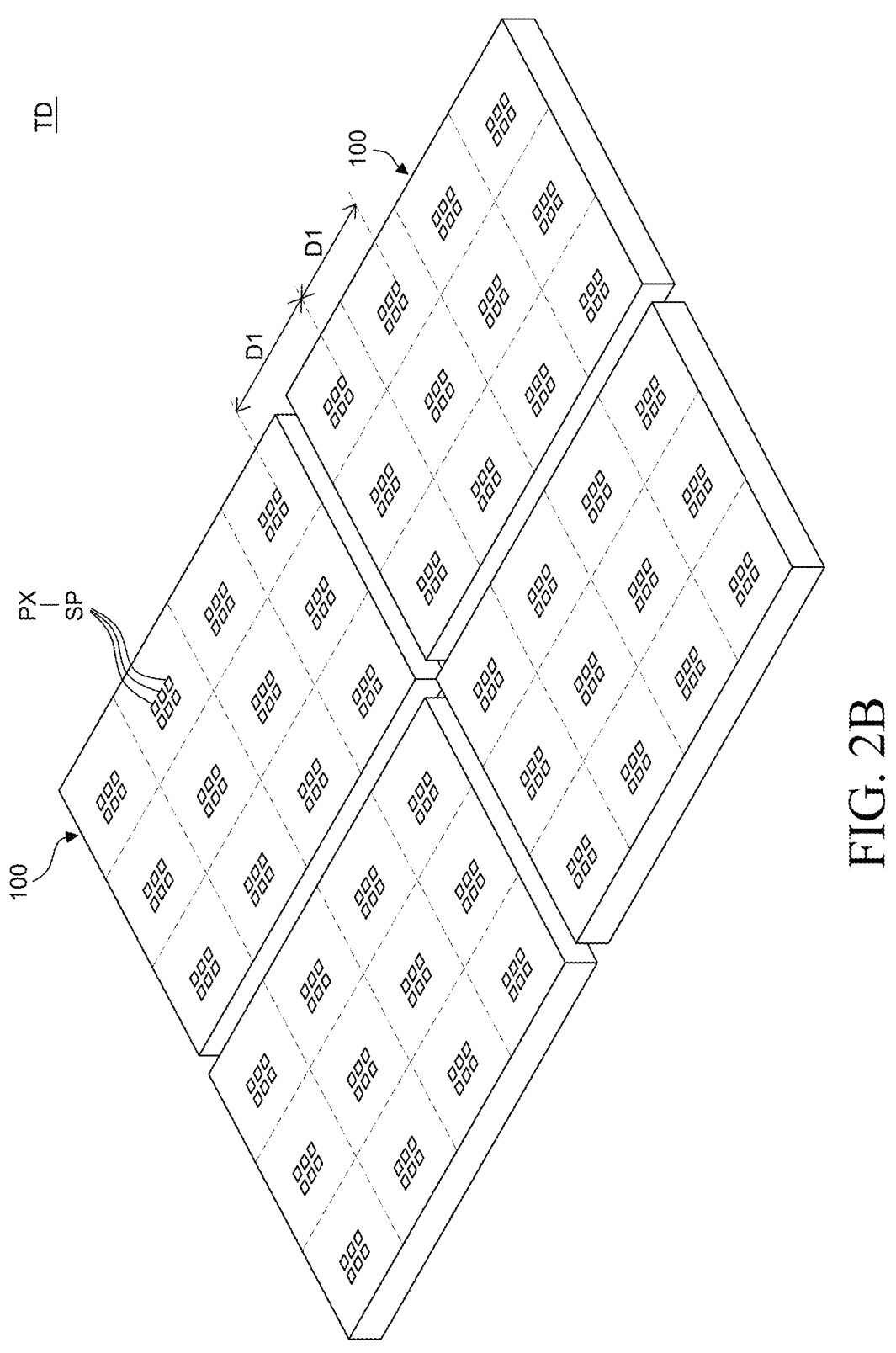
FIG. 2B is a perspective view of a tiling display device according to an example embodiment of the present disclosure.

FIG. 1 is a schematic diagram of a display device according to an example embodiment of the present disclosure. FIG. 2A is a partial cross-sectional view of a display device according to an example embodiment of the present disclosure. FIG. 2B is a perspective view of a tiling display device according to an example embodiment of the present disclosure. In FIG. 1, for the convenience of description, among various components of the display device 100, only a display panel PN, a gate driver GD, a data driver DD, and a timing controller TC are illustrated.

As shown in FIG. 1, the display device 100 includes a display panel PN including a plurality of sub pixels SP, a gate driver GD and a data driver DD configured to supply various signals to the display panel PN, and a timing controller TC configured to control the gate driver GD and the data driver DD.

The gate driver GD may supply a plurality of scan signals to a plurality of scan lines SL in accordance with a plurality of gate control signals supplied from the timing controller TC. Even though FIG. 1 illustrates an example in which one gate driver GD is disposed to be spaced apart from one side of the display panel PN, the number of the gate drivers GD and the placement thereof are not limited thereto.

The data driver DD may convert image data input from the timing controller TC into a data voltage using a reference gamma voltage in accordance with a plurality of data control signals supplied from the timing controller TC. The data driver DD may supply the converted data voltage to the plurality of data lines DL.

The timing controller TC may align image data input from an external source to supply the image data to the data driver DD. The timing controller TC may generate a gate control signal and a data control signal using synchronization signals, such as a dot clock signal, a data enable signal, and horizontal/vertical synchronization signals, input from the external source. The timing controller TC may supply the generated gate control signal and data control signal to the gate driver GD and the data driver DD, respectively, to control the gate driver GD and the data driver DD.

The display panel PN is configured to display images to the user and includes the plurality of sub pixels SP. In the display panel PN, the plurality of scan lines SL and the plurality of data lines DL intersect each other, and the plurality of sub pixels SP may be connected to the scan lines SL and the data lines DL, respectively. In addition, even though not illustrated in the drawing, each of the plurality of sub pixels SP may be connected to a high potential power line, a low potential power line, a reference line, and the like.

In the display panel PN, an active area AA and the non-active area NA surrounding the active area AA may be defined.

The active area AA is an area in which images are displayed in the display device 100. In the active area AA, a plurality of sub pixels SP configuring a plurality of pixels PX and a circuit for driving the plurality of sub pixels SP may be disposed. The plurality of sub pixels SP is a minimum unit which configures the active area AA, and n sub pixels SP may form one pixel PX. In each of the plurality of sub pixels SP, a light emitting diode, a thin film transistor for driving the light emitting diode, and the like may be disposed. The plurality of light emitting diodes may be defined in different manners depending on the type of the display panel PN. For example, where the display panel PN is an inorganic light emitting display panel, the light emitting diode may be a light emitting diode (LED) or a micro light emitting diode (LED).

In the active area AA, a plurality of wiring lines for transmitting various signals to the plurality of sub pixels SP may be disposed. For example, the plurality of wiring lines may include a plurality of data lines DL for supplying a data voltage respectively to the plurality of sub pixels SP, a plurality of scan lines SL for supplying a scan signal respectively to the plurality of sub pixels SP, and the like. The plurality of scan lines SL extend in one direction in the active area AA to be connected respectively to the plurality of sub pixels SP, and the plurality of data lines DL extend in a direction different from the one direction in the active area AA to be connected respectively to the plurality of sub pixels SP. In addition, in the active area AA, a low potential power line, a high potential power line, and the like may be further disposed, but the present disclosure is not limited thereto.

The non-active area NA is an area where images are not displayed so that the non-active area NA may be defined as an area extending from and outside the active area AA. In the non-active area NA, a link line for transmitting a signal to the sub pixel SP of the active area AA, a pad electrode, a driving integrated circuit (IC), such as a gate driver IC or a data driver IC, or the like may be disposed.

As other examples, the non-active area NA may be located on a rear surface of the display panel PN, that is, a surface on which the sub pixels SP are not disposed, or may be omitted. The non-active area NA is not limited as illustrated in the drawing.

In the meantime, a driver, such as a gate driver GD, a data driver DD, and a timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner. For example, the data driver DD and the timing controller TC may be formed in separate flexible film and printed circuit board. The data driver DD and the timing controller TC may be electrically connected to the display panel PN by bonding the flexible film and the printed circuit board to the pad electrode formed in the non-active area NA of the display panel PN.

If the gate driver GD is mounted in the GIP manner and the data driver DD and the timing controller TC transmit a signal to the display panel PN through a pad electrode of the non-active area NA, an area of the non-active area NA greater than a predetermined level may be needed for disposing the gate driver GD and the pad electrode. Accordingly, a size of the bezel may be increased.

In contrast, if the gate driver GD is mounted in the active area AA in the GIA manner and a side line SRL connecting the signal line on the front surface of the display panel PN to the pad electrode on a rear surface of the display panel PN is formed to bond the flexible film and the printed circuit board onto a rear surface of the display panel PN, the non-active area NA may be minimized on the front surface of the display panel PN. That is, if the gate driver GD, the data driver DD, and the timing controller TC are connected to the display panel PN as described above, a zero bezel with substantially no bezel may be implemented.

Specifically, as illustrated in FIGS. 2A and 2B, in the non-active area NA of the display panel PN, a plurality of pad electrodes for transmitting various signals to the plurality of sub pixels SP may be disposed. For example, in the non-active area NA on the front surface of the display panel PN, a first pad electrode PAD1 for transmitting a signal to the plurality of sub pixels SP may be disposed. In the non-active area NA on the rear surface of the display panel PN, a second pad electrode PAD2 electrically connected to a driving component, such as a flexible film and the printed circuit board, may be disposed. That is, in the non-active area NA on the front surface of the display panel PN on which images are displayed, only a pad area including the first pad electrode PAD1 may be formed at a minimum.

In this case, even though not illustrated in the drawing, various signal lines connected to the plurality of sub pixels SP, for example, a scan line SL, a data line DL, or the like, extend from the active area AA to the non-active area NA to be electrically connected to the first pad electrode PAD1.

The side line SRL may be disposed along a side surface of the display panel PN. The side line SRL may electrically connect a first pad electrode PAD1 on the front surface of the display panel PN and a second pad electrode PAD2 on the rear surface of the display panel PN. Therefore, a signal from a driving component on the rear surface of the display panel PN may be transmitted to the plurality of sub pixels SP through the second pad electrode PAD2, the side line SRL, and the first pad electrode PAD1. Accordingly, a signal transmitting path from the front surface of the display panel PN to the side surface and the rear surface may be formed to minimize an area of the non-active area NA on the front surface of the display panel PN.

As shown in FIG. 2B, a tiling display device TD having a large combined screen size may be implemented by connecting a plurality of display devices 100. Here, as illustrated in FIG. 2A, if the tiling display device TD is implemented using a display device 100 with a minimized bezel, a seam area in which an image between the display devices 100 is not displayed may be minimized so that a display quality may be improved.

For example, the plurality of sub pixels SP may form one pixel PX, and a distance D1 between an outermost pixel PX of one display device 100 and an outermost pixel PX of another display device 100 adjacent to the one display device may be implemented to be equal to a distance D1 between adjacent pixels PX in the one display device 100. Accordingly, a constant distance D1 between pixels PX across the display devices 100 may be configured to minimize the seam area.

However, FIGS. 2A and 2B are illustrative so that the display device 100 according to an example embodiment of the present disclosure may be a general display device 100 with a bezel, but is not limited thereto.

Figure 3:
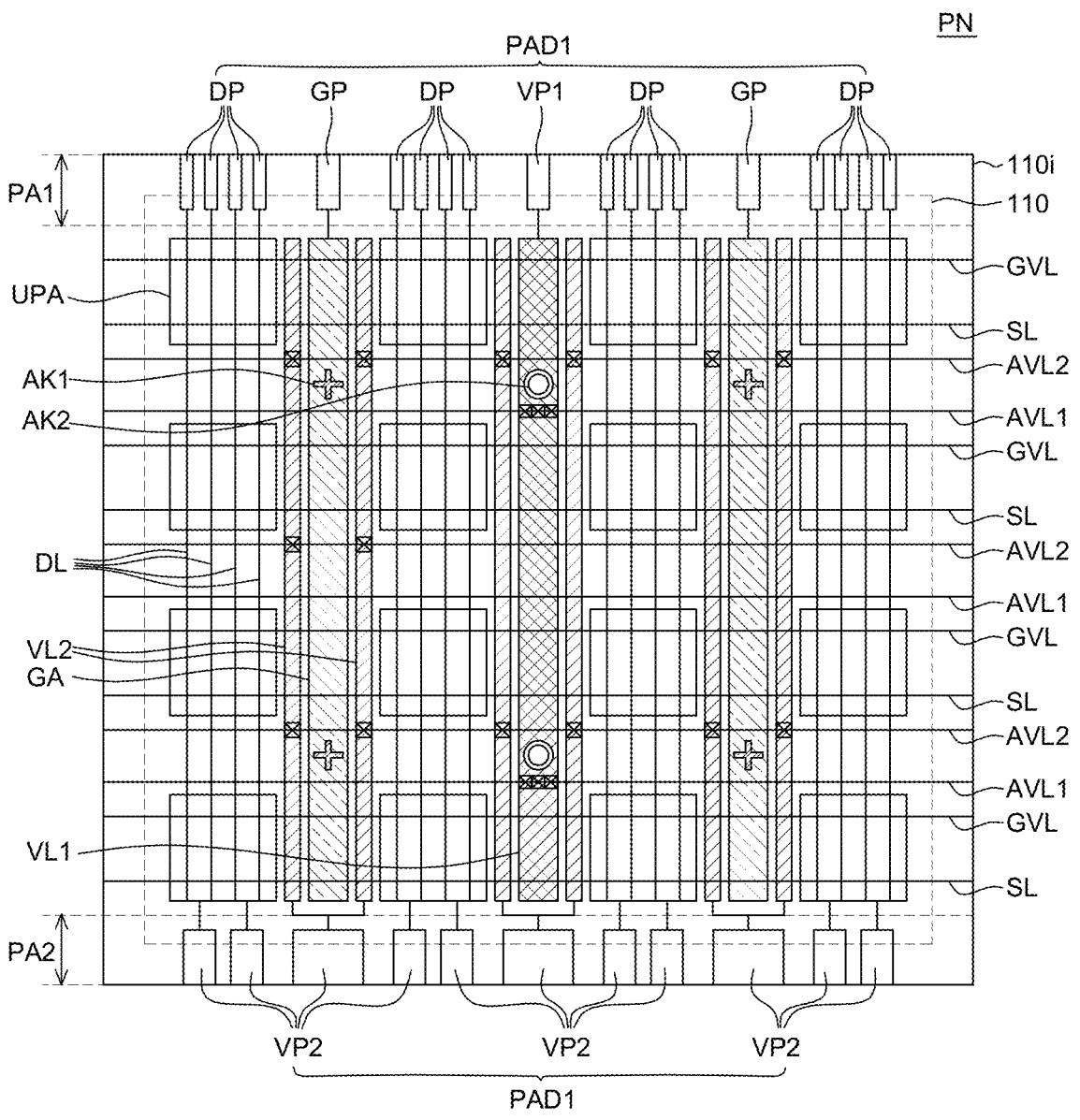
FIG. 3 is a plan view of a display panel of a display device according to an example embodiment of the present disclosure.
Figure 4:
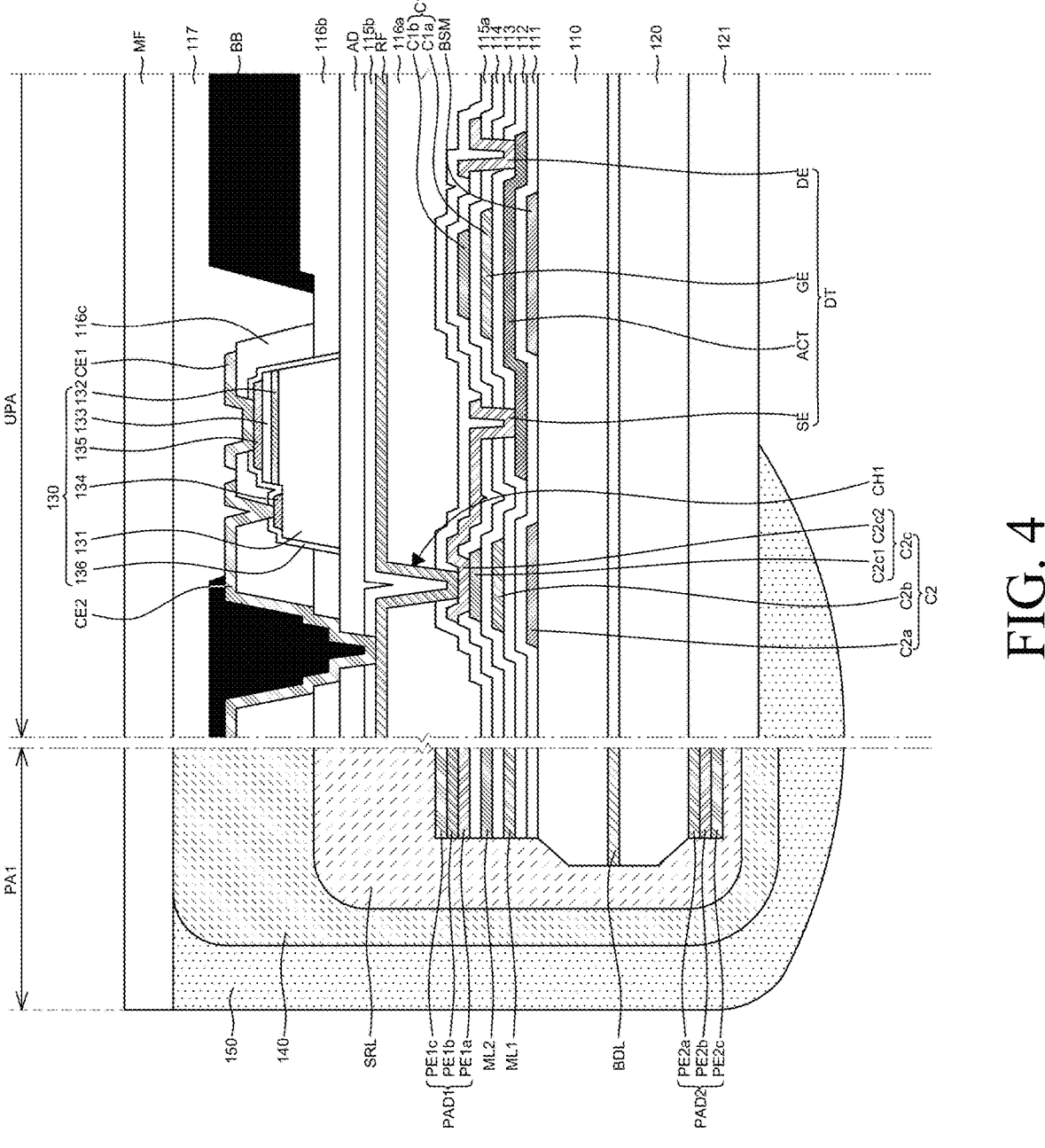
FIG. 4 is a cross-sectional view of a display device according to an example embodiment of the present disclosure.

FIG. 3 is a plan view of a display panel of a display device according to an example embodiment of the present disclosure. FIG. 4 is a cross-sectional view of a display device according to an example embodiment of the present disclosure.

First, as illustrated in FIGS. 3 and 4, the display panel PN includes a first substrate 110. The first substrate 110 is a substrate which supports components disposed above the display device 100 and may be an insulating substrate. A plurality of pixels PX may be formed on the first substrate 110 to display images. For example, the first substrate 110 may be formed of glass, resin, or the like. Further, the first substrate 110 may include polymer or plastic. In some example embodiments, the first substrate 110 may be formed of a plastic material having flexibility.

In the first substrate 110, a plurality of pixel areas UPA, a plurality of gate driving areas GA, and a plurality of pad areas PA1 and PA2 may be disposed. Among them, the plurality of pixel areas UPA and the plurality of gate driving areas GA may be included in the active area AA of the display panel PN.

First, the plurality of pixel areas UPA are areas in which the plurality of pixels PX are disposed. The plurality of pixel areas UPA may be disposed by forming a plurality of rows and a plurality of columns. Each of the plurality of pixels PX disposed in the plurality of pixel areas UPA may include a plurality of sub pixels SP. Each of the plurality of sub pixels SP may include a light emitting diode 130 and a pixel circuit to independently control the light emitting diode 130 to emit light. The plurality of sub pixels SP may include a plurality of sub pixels SP configured to emit different colored lights. For example, the plurality of sub pixels SP may include a red sub pixel, a blue sub pixel, a green sub pixel, and the like, but are not limited thereto.

The plurality of gate driving areas GA are areas where gate drivers GD are disposed. The gate driver GD may be mounted in the active area AA in a gate in active area (GIA) manner. For example, the gate driving area GA may be formed along a row direction and/or a column direction between the plurality of pixel areas UPA. The gate driver GD formed in the gate driving area GA may supply the scan signal to the plurality of scan lines SL.

The gate driver GD disposed in the gate driving area GA may include a circuit for outputting a scan signal. For example, the gate driver may include a plurality of transistors and/or capacitors. Here, active layers of the plurality of transistors may be formed of a semiconductor material, such as an oxide semiconductor, amorphous silicon, or polysilicon, but are not limited thereto. The active layers of the plurality of transistors may be formed of the same material or of different materials from each other. Further, the active layers of the transistors of the gate driver may be formed of the same material as active layers of various transistors of the pixel circuit or may be formed of different materials from each other.

The plurality of pad areas PA1 and PA2 are areas in which a plurality of first pad electrodes PAD1 are disposed. The plurality of first pad electrodes PAD1 may transmit various signals to various wiring lines extending in a column direction in the active area AA. For example, the plurality of first pad electrodes PAD1 may include a data pad DP, a gate pad GP, a high potential power pad VP1, and a low potential power pad VP2. The data pad DP may transmit a data voltage to the data line DL, and the gate pad GP may transmit a clock signal, a start signal, a gate low voltage, a gate high voltage, and the like for driving the gate driver GD to the gate driver GD. The high potential power pad VP1 may transmit a high potential power voltage to the high potential power line VL1, and the low potential power pad VP2 may transmit a low potential power voltage to the low potential power line VL2.

The plurality of pad areas PA1 and PA2 may include a first pad area PA1 located at an upper edge of the display panel PN and a second pad area PA2 located at a lower edge of the display panel PN. Here, in the first pad area PA1 and the second pad area PA2, different types of first pad electrodes PAD1 may be disposed. For example, among the plurality of first pad electrodes PAD1, the data pad DP, the gate pad GP, and the high potential power pad VP1 may be disposed in the first pad area PA1, and the low potential power pad VP2 may be disposed in the second pad area PA2.

Here, the plurality of first pad electrodes PAD1 may be formed to have different sizes, respectively. For example, the plurality of data pads DP connected to the plurality of data lines DL one to one may have a smaller width, and the high potential power pad VP1, the low potential power pad VP2, and the gate pad GP may have a larger width. However, widths of the data pad DP, the gate pad GP, the high potential power pad VP1, and the low potential power pad VP2 are illustrated in FIG. 3 by way of example so that the first pad electrode PAD1 may be configured in various sizes and is not limited to the example shown in FIG. 3.

In the meantime, to reduce the bezel of the display panel PN, an edge of the display panel PN may be cut to be removed. The plurality of pixels PX, the plurality of wiring lines, and the plurality of first pad electrodes PAD1 may be formed on an initial first substrate 110i, and an edge part of the initial first substrate 110i may be ground to reduce the bezel area. During the grinding process, a part of the initial first substrate 110i may be removed to form a first substrate 110 with a smaller size. At this time, parts of the plurality of first pad electrodes PAD1 and wiring lines disposed at the edge of the first substrate 110 may be removed. Accordingly, only a part of the plurality of first pad electrodes PAD1 may remain on the first substrate 110.

Next, the plurality of data lines DL extending in a column direction from the plurality of first pad electrodes PAD1 may be disposed on the first substrate 110 of the display panel PN. The plurality of data lines DL may extend from the plurality of data pads DP of the first pad area PA1 toward the plurality of pixel areas UPA. The plurality of data lines DL may extend in a column direction and may be disposed to overlap the plurality of pixel areas UPA. Therefore, the plurality of data lines DL may transmit the data voltage to the pixel circuit of each of the plurality of sub pixels SP.

The plurality of high potential power lines VL1 extending in the column direction may be disposed on the first substrate 110 of the display panel PN. Some of the plurality of high potential power lines VL1 may extend from the high potential power pads VP1 of the first pad area PA1 to the plurality of pixel areas UPA to transmit the high potential power voltage to the light emitting diode 130 of each of the plurality of sub pixels SP. The others of the plurality of high potential power lines VL1 may be electrically connected to other high potential power lines VL1 by means of auxiliary high potential power lines AVL1 to be described below. In FIG. 3, for the convenience of description, even though one high potential power line VL1 and one high potential power pad VP1 are illustrated as disposed on the first substrate 110 as an example, a plurality of high potential power lines VL1 and high potential power pads VP1 may be disposed.

The plurality of low potential power lines VL2 extending in the column direction may be disposed on the first substrate 110 of the display panel PN. At least some of the plurality of low potential power lines VL2 may extend from the low potential power pads VP2 of the second pad area PA2 to the plurality of pixel areas UPA to transmit the low potential power voltage to the pixel circuit of each of the plurality of sub pixels SP. The others of the plurality of low potential power lines VL2 may be electrically connected to other low potential power lines VL2 by means of auxiliary low potential power lines AVL2 to be described below.

The plurality of scan lines SL extending in the row direction may be disposed on the first substrate 110 of the display panel PN. The plurality of scan lines SL may extend in the row direction and may be disposed across the plurality of pixel areas UPA and the plurality of gate driving areas GA. The plurality of scan lines SL may transmit the scan signal from the gate driver GD to the pixel circuits of the plurality of sub pixels SP.

A plurality of auxiliary high potential power lines AVL1 extending in the row direction may be disposed on the first substrate 110 of the display panel PN. The plurality of auxiliary high potential power lines AVL1 may be disposed in an area between the plurality of pixel areas UPA. The plurality of auxiliary high potential power lines AVL1 extending in the row direction may be electrically connected to the plurality of high potential power lines VL1 extending in the column direction through contact holes and may form a mesh structure. Therefore, the plurality of auxiliary high potential power lines AVL1 and the plurality of high potential power lines VL1 may be configured to form a mesh structure to minimize a voltage drop and voltage deviation.

A plurality of auxiliary low potential power lines AVL2 extending in the row direction may be disposed on the first substrate 110 of the display panel PN. The plurality of auxiliary low potential power lines AVL2 may be disposed in an area between the plurality of pixel areas UPA. The plurality of auxiliary low potential power lines AVL2 extending in the row direction may be electrically connected to the plurality of low potential power lines VL2 extending in the column direction through contact holes to form a mesh structure. Therefore, the plurality of auxiliary low potential power lines AVL2 and the plurality of low potential power lines VL2 may be configured to form a mesh structure to reduce a resistance of the wiring line and minimize voltage deviation.

The plurality of gate driving lines GVL extending in the row direction may be disposed on the first substrate 110 of the display panel PN. The plurality of gate driving lines GVL may transmit various signals to the gate driver GD of the gate driving area GA. The plurality of gate driving lines GVL may include wiring lines for transmitting a clock signal, a start signal, a gate high voltage, a gate low voltage, and the like to the gate driver GD. Therefore, various signals may be transmitted from the gate driving line GVL to the gate driver GD to drive the gate driver GD.

A plurality of alignment keys AK1 and AK2 may be disposed in an area between the plurality of pixel areas UPA in the display panel PN. The plurality of alignment keys AK1 and AK2 may be used for alignment during the manufacturing process of the display panel PN. The plurality of alignment keys AK1 and AK2 may include a first alignment key AK1 and a second alignment key AK2.

The first alignment key AK1 may be disposed in the gate driving area GA between the plurality of pixel areas UPA. The first alignment key AK1 may be used to inspect an alignment position of the plurality of light emitting diodes 130. For example, the first alignment key AK1 may have a cross shape but is not limited thereto.

The second alignment key AK2 may be disposed to overlap the high potential power line VL1 between the plurality of pixel areas UPA. In the high potential power line VL1, a hole overlapping the second alignment key AK2 may be formed to separate the second alignment key AK2 and the high potential power line VL1. The second alignment key AK2 may be used to align the display panel PN and a donor. The display panel PN and the donor may be aligned using the second alignment key AK2, and the plurality of light emitting diodes 130 of the donor may be transferred onto the display panel PN. For example, the second alignment key AK2 may have a circular ring shapee but is not limited thereto.

As shown in FIG. 4, the pixel circuit for driving the light emitting diode 130 is disposed in each of the plurality of sub pixels SP on the first substrate 110. The pixel circuit may include a plurality of thin film transistors and a plurality of capacitors. In FIG. 4, for the convenience of description, only a driving transistor DT, a first capacitor C1, and a second capacitor C2, among configurations of the pixel circuit, are illustrated as an example. However, the pixel circuit may further include a switching transistor, a sensing transistor, an emission control transistor, and the like, and is not limited thereto.

First, a light shielding layer BSM may be disposed on the first substrate 110. The light shielding layer BSM may block light from being incident on an active layer ACT of the plurality of transistors to minimize a leakage current. For example, the light shielding layer BSM may be disposed below the active layer ACT of the driving transistor DT to block light from being incident on the active layer ACT. If light is irradiated onto the active layer ACT, a leakage current may be generated, thus deteriorating the reliability of the transistor. Accordingly, the light shielding layer BSM for blocking the light may be disposed on the first substrate 110 to improve the reliability of the driving transistor DT. The light shielding layer BSM may be configured by an opaque conductive material, such as copper (Cu), aluminum (Al), molybdenum (Mo), nickel (Ni), titanium (Ti), chrome (Cr), or an alloy thereof, but is not limited thereto.

A buffer layer 111 may be disposed on the light shielding layer BSM. The buffer layer 111 may reduce permeation of moisture or impurities through the first substrate 110. For example, the buffer layer 111 may be configured by a single layer or a double layer of silicon oxide (SiOx) or silicon nitride (SiNx), but is not limited thereto. However, the buffer layer 111 may be omitted depending on a type of the first substrate 110 or a type of the thin film transistor, and is not limited thereto.

A driving transistor DT including an active layer ACT, a gate electrode GE, a source electrode SE, and a drain electrode DE may be disposed on the buffer layer 111.

First, the active layer ACT of the driving transistor DT may be disposed on the buffer layer 111. The active layer ACT may be formed of a semiconductor material, such as an oxide semiconductor, amorphous silicon, or polysilicon, but is not limited thereto. Further, even though not illustrated in the drawings, transistors other than the driving transistor DT, such as a switching transistor, a sensing transistor, and an emission control transistor, may be further disposed. The active layers of these other transistors may be also formed of a semiconductor material, such as an oxide semiconductor, amorphous silicon, or polysilicon, but are not limited thereto. The active layers of the transistors included in the pixel circuit, such as the driving transistor DT, the switching transistor, the sensing transistor, and the emission control transistor, may be formed of the same material, or may be formed of different materials.

A gate insulating layer 112 may be disposed on the active layer ACT. The gate insulating layer 112 is an insulating layer which electrically insulates the active layer ACT from the gate electrode GE and may be configured by a single layer or a double layer of silicon oxide (SiOx) or silicon nitride (SiNx), but is not limited thereto.

The gate electrode GE may be disposed on the gate insulating layer 112. The gate electrode GE may be configured by a conductive material, such as copper (Cu), aluminum (Al), molybdenum (Mo), nickel (Ni), titanium (Ti), chrome (Cr), or an alloy thereof, but is not limited thereto.

A first interlayer insulating layer 113 and a second interlayer insulating layer 114 are disposed on the gate electrode GE. In the first interlayer insulating layer 113 and the second interlayer insulating layer 114, contact holes through which the source electrode SE and the drain electrode DE are connected to the active layer ACT may be formed. The first interlayer insulating layer 113 and the second interlayer insulating layer 114 are insulating layers which protect components therebelow and may be configured by single layers or double layers of silicon oxide (SiOx) or silicon nitride (SiNx), but are not limited thereto.

The source electrode SE and the drain electrode DE electrically connected to the active layer ACT may be disposed on the second interlayer insulating layer 114. The source electrode SE may be connected to the second capacitor C2 and the first electrode 134 of the light emitting diode 130, and the drain electrode DE is connected to another element in the pixel circuit. The source electrode SE and the drain electrode DE may be configured by a conductive material, such as copper (Cu), aluminum (Al), molybdenum (Mo), nickel (Ni), titanium (Ti), chrome (Cr), or an alloy thereof, but are not limited thereto.

Next, the first capacitor C1 may be disposed on the gate insulating layer 112. The first capacitor C1 may include a 1-1-th capacitor electrode C1a and a 1-2-th capacitor electrode C1b. First, the 1-1-th capacitor electrode C1a may be disposed on the gate insulating layer 112. The 1-1-th capacitor electrode C1a may be integrally formed with the gate electrode GE of the driving transistor DT.

The 1-2-th capacitor electrode C1b may be disposed on the first interlayer insulating layer 113. The 1-2-th capacitor electrode C1b may be disposed to overlap the 1-1-th capacitor electrode C1a with the first interlayer insulating layer 113 therebetween.

Therefore, the first capacitor C1 may be connected to the gate electrode GE of the driving transistor DT to maintain a voltage of the gate electrode GE of the driving transistor DT for a predetermined period.

Next, the second capacitor C2 may be disposed on the first substrate 110. The second capacitor C2 may include a 2-1-th capacitor electrode C2a, a 2-2-th capacitor electrode C2b, and a 2-3-th capacitor electrode C2c. The second capacitor C2 may include the 2-1-th capacitor electrode C2a which is a lower capacitor electrode, the 2-2-th capacitor electrode C2b which is an intermediate capacitor electrode, and the 2-3-th capacitor electrode C2c which is an upper capacitor electrode.

The 2-1-th capacitor electrode C2a may be disposed on the first substrate 110. The 2-1-th capacitor electrode C2a may be disposed on the same layer as the light shielding layer BSM and may be formed of the same material as the light shielding layer BSM.

The 2-2-th capacitor electrode C2b may be disposed on the buffer layer 111 and the gate insulating layer 112. The 2-2-th capacitor electrode C2b may be disposed on the same layer as the gate electrode GE and may be formed of the same material as the gate electrode GE.

The 2-3-th capacitor electrode C2c may be disposed on the first interlayer insulating layer 113. The 2-3-th capacitor electrode C2c may be configured by a first layer C2c1 and a second layer C2c2. The first layer C2c1 of the 2-3-th capacitor electrode C2c may be formed on the same layer as the 1-2-th capacitor electrode C1b with the same material. The first layer C2c1 may be disposed to overlap the 2-1-th capacitor electrode C2a and the 2-2-th capacitor electrode C2b with the first interlayer insulating layer 113 therebetween.

The second layer C2c2 of the 2-3-th capacitor electrode C2c may be disposed on the second interlayer insulating layer 114. The second layer C2c2 may be a part extending from the source electrode SE of the driving transistor DT and may be connected to the first layer C2c1 through a contact hole in the second interlayer insulating layer 114.

Accordingly, the second capacitor C2 may be electrically connected between the source electrode SE of the driving transistor DT and the light emitting diode 130 to increase capacitance inherent in the light emitting diode 130 and to allow the light emitting diode 130 to emit light with a higher luminance.

A first passivation layer 115a may be disposed on the driving transistor DT, the first capacitor C1, and the second capacitor C2. The first passivation layer 115a is an insulating layer which protects components below the first passivation layer 115a and may be configured by an inorganic material, such as silicon oxide SiOx or silicon nitride SiNx, but is not limited thereto.

A first planarization layer 116a may be disposed on the first passivation layer 115a. The first planarization layer 116a may planarize an upper portion of the pixel circuit including the driving transistor DT. The first planarization layer 116a may be configured by a single layer or a double layer. For example, the first planarization layer 116a may be configured by benzocyclobutene or an acrylic organic material, but is not limited thereto.

The reflection plate RF may be disposed on the first planarization layer 116a. The reflection plate RF is a configuration for reflecting light emitted from the plurality of light emitting diodes 130 above the first substrate 110 and may be formed with a shape corresponding to each of the plurality of sub pixels SP. One reflection plate RF may be disposed to cover the most area of one sub pixel SP. The reflection plate RF may reflect the light emitted from the light emitting diode 130 and may also be used as an electrode which electrically connects the light emitting diode 130 and the pixel circuit. Specifically, the reflection plate RF may be electrically connected to the source electrode SE of the driving transistor DT and the second capacitor C2 through a first contact hole CHI of the first planarization layer 116a and the first passivation layer 115a. The reflection plate RF may be electrically connected to the first electrode 134 of the light emitting diode 130 through the second connection electrode CE2. Therefore, the reflection plate RF may electrically connect the driving transistor DT and the first electrode 134 of the light emitting diode 130. However, the reflection plate RF may electrically connect the second electrode 135 of the light emitting diode 130 and the high potential power line VL1, instead of connecting the first electrode 134 of the light emitting diode 130 and the driving transistor DT, but is not limited thereto.

The reflection plate RF may include various conductive layers in consideration of a light reflection efficiency and a resistance. For example, the reflection plate RF may use an opaque conductive layer, such as silver (Ag), aluminum (Al), molybdenum (Mo), titanium (Ti), or an alloy thereof, and a transparent conductive layer, such as indium tin oxide, but the structure of the reflection plate RF is not limited thereto.

The second passivation layer 115b may be disposed on the reflection plate RF. The second passivation layer 115b is an insulating layer which protects components below the second passivation layer 115b and may be configured by a single layer or a double layer of silicon oxide (SiOx) or silicon nitride (SiNx), but is not limited thereto.

An adhesive layer AD may be disposed on the second passivation layer 115b. The adhesive layer AD may be formed on the entire surface of the first substrate 110 to fix the light emitting diode 130 disposed on the adhesive layer AD. The adhesive layer AD may be formed of a photo curable adhesive material which is cured by light. For example, the adhesive layer AD may be formed of an acrylic material including a photoresist but is not limited thereto. The adhesive layer AD may be formed on the entire surface of the first substrate 110 excluding pad areas PA1 and PA2 in which the first pad electrode PAD1 is disposed.

The plurality of light emitting diodes 130 may be disposed in each of the plurality of sub pixels SP on the adhesive layer AD. The light emitting diode 130 is an element configured to emit light by a current and may include a red light emitting diode which emits red light, a green light emitting diode which emits green light, and a blue light emitting diode which emits blue light and may implement light with various colors including white by a combination thereof. For example, the light emitting diode 130 may be a light emitting diode (LED) or a micro LED, but is not limited thereto.

The plurality of light emitting diodes 130 may include a first semiconductor layer 131, an emission layer 132, a second semiconductor layer 133, a first electrode 134, and a second electrode 135.

The first semiconductor layer 131 may be disposed on the adhesive layer AD, and the second semiconductor layer 133 may be disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may be layers doped with n-type and p-type impurities into a material, such as gallium nitride (GaN), indium aluminum phosphide (InAlP), or gallium arsenide (GaAs). The p-type impurity may be magnesium (Mg), zinc (Zn), beryllium (Be), and the like, and the n-type impurity may be silicon (Si), germanium, tin (Sn), and the like, but are not limited thereto.

The emission layer 132 may be disposed between the first semiconductor layer 131 and the second semiconductor layer 133. The emission layer 132 may be supplied with holes and electrons from the first semiconductor layer 131 and the second semiconductor layer 133 to emit light. The emission layer 132 may be formed by a single layer or a multi-quantum well (MQW) structure, and for example, may be formed of indium gallium nitride (InGaN), gallium nitride (GaN), or the like, but is not limited thereto.

The first electrode 134 may be disposed on the first semiconductor layer 131. The first electrode 134 may be an electrode which electrically connects the driving transistor DT and the first semiconductor layer 131. In this case, the first semiconductor layer 131 may be a semiconductor layer doped with an n-type impurity, and the first electrode 134 may be a cathode. The first electrode 134 may be disposed on a top surface of the first semiconductor layer 131 which is exposed from the emission layer 132 and the second semiconductor layer 133. The first electrode 134 may be configured by a conductive material, for example, a transparent conductive material, such as indium tin oxide (ITO) or indium zinc oxide (IZO), or an opaque conductive material, such as titanium (Ti), gold (Au), silver (Ag), copper (Cu) or an alloy thereof, but is not limited thereto.

The second electrode 135 may be disposed on the second semiconductor layer 133. The second electrode 135 may be disposed on the top surface of the second semiconductor layer 133. The second electrode 135 may be an electrode which electrically connects the high potential power line VL1 and the second semiconductor layer 133. In this case, the second semiconductor layer 133 may be a semiconductor layer doped with a p-type impurity, and the second electrode 135 may be an anode. The second electrode 135 may be configured by a conductive material, for example, a transparent conductive material, such as indium tin oxide (ITO) or indium zinc oxide (IZO), or an opaque conductive material, such as titanium (Ti), gold (Au), silver (Ag), copper (Cu) or an alloy thereof, but is not limited thereto.

Next, the encapsulation layer 136 which encloses the first semiconductor layer 131, the emission layer 132, the second semiconductor layer 133, the first electrode 134, and the second electrode 135 may be disposed. The encapsulation layer 136 may be formed of an insulating material to protect the first semiconductor layer 131, the emission layer 132, and the second semiconductor layer 133. In the encapsulation layer 136, contact holes respectively exposing the first electrode 134 and the second electrode 135 may be formed to electrically connect a first connection electrode CE1 and a second connection electrode CE2 to the first electrode 134 and the second electrode 135, respectively.

In the meantime, a part of the side surface of the first semiconductor layer 131 may be exposed from the encapsulation layer 136. The light emitting diode 130 manufactured on the wafer may be separated from the wafer to be transferred onto the display panel PN. However, during the process of separating the light emitting diode 130 from the wafer, a part of the encapsulation layer 136 may be torn. For example, a part of the encapsulation layer 136 adjacent to a lower edge of the first semiconductor layer 131 of the light emitting diode 130 may be torn during the process of separating the light emitting diode 130 from the wafer. Accordingly, a part of a lower side surface of the first semiconductor layer 131 may be exposed to the outside. However, even though the lower portion of the light emitting diode 130 may be exposed from the encapsulation layer 136, the first connection electrode CE1 and the second connection electrode CE2 may be formed after forming the second planarization layer 116b and the third planarization layer 116c which cover the side surface of the first semiconductor layer 131. Accordingly, a short defect may be reduced or prevented.

Next, the second planarization layer 116b and the third planarization layer 116c may be disposed on the adhesive layer AD and the light emitting diode 130.

The second planarization layer 116b may overlap a part of side surfaces of the plurality of light emitting diodes 130 to fix and protect the plurality of light emitting diodes 130. The second planarization layer 116b may be formed using a halftone mask. Therefore, the second planarization layer 116b may be formed to have a step.

Specifically, a part of the second planarization layer 116b relatively adjacent to the light emitting diode 130 may be formed to have a smaller thickness, and a part farther away from the light emitting diode 130 may be formed to have a larger thickness. A part of the second planarization layer 116b adjacent to the light emitting diode 130 may be disposed to enclose the light emitting diode 130 and also may be in contact with a side surface of the light emitting diode 130. Therefore, a torn part of the encapsulation layer 136 which protects a side surface of the first semiconductor layer 131 of the light emitting diode 130 during the process of separating the light emitting diode 130 from the wafer to be transferred onto the display panel PN may be covered by the second planarization layer 116b. By doing this, later defects in contacts, as well as short defects, of the connection electrodes CE1 and CE2 and the first semiconductor layer 131 may be suppressed.

The third planarization layer 116c may be formed to cover upper portions of the second planarization layer 116b and the light emitting diode 130, and contact holes respectively exposing the first electrode 134 and the second electrode 135 of the light emitting diode 130 may be formed. The first electrode 134 and the second electrode 135 of the light emitting diode 130 may be exposed from the third planarization layer 116c, and the third planarization layer 116c may be partially disposed in an area between the first electrode 134 and the second electrode 135 to reduce a short defect. The second planarization layer 116b and the third planarization layer 116c may each be configured by a single layer or a double layer, and for example, may be formed of photoresist or an acrylic organic material, but is not limited thereto.

In the meantime, the third planarization layer 116c may cover only the light emitting diode 130 and an area adjacent to the light emitting diode 130. The third planarization layer 116c may be disposed in an area of the sub pixel SP enclosed by the bank BB and may be disposed in an island shape. Therefore, the bank BB may be disposed in a part of the top surface of the second planarization layer 116b and the third planarization layer 116c may be disposed in the other part of the top surface of the second planarization layer 116b.

The first connection electrode CE1 and the second connection electrode CE2 may be disposed on the third planarization layer 116c. The first connection electrode CE1 may be an electrode which electrically connects the second electrode 135 of the light emitting diode 130 and the high potential power line VL1. The first connection electrode CE1 may be electrically connected to the second electrode 135 of the light emitting diode 130 through a contact hole formed in the third planarization layer 116c.

The second connection electrode CE2 may be an electrode which electrically connects the first electrode 134 of the light emitting diode 130 and the driving transistor DT. The second connection electrode CE2 may be connected to the reflection plate RF of each of the plurality of sub pixels SP through contact holes formed in the third planarization layer 116c, the second planarization layer 116b, the adhesive layer AD, and the second passivation layer 115b. Here, the reflection plate RF may also be connected to the source electrode SE of the driving transistor DT so that the source electrode SE of the driving transistor DT and the first electrode 134 of the light emitting diode 130 may be electrically connected to each other.

A bank BB may be disposed on the second planarization layer 116b exposed from the first connection electrode CE1 and the second connection electrode CE2 and from the third planarization layer 116c. The bank BB may be disposed to be spaced apart from the light emitting diode 130 with a predetermined interval and may at least partially overlap the reflection plate RF. For example, the bank BB may cover a part of the second connection electrode CE2 formed in the contact holes of the third planarization layer 116c and the second planarization layer 116b. Further, for example, the bank BB may be disposed on the second planarization layer 116b with a predetermined interval from the light emitting diode 130. In this case, the bank BB and the third planarization layer 116c may be spaced apart from each other on a part of the second planarization layer 116b having a smaller thickness. That is, an end of the bank BB and an end of the third planarization layer 116c may be disposed to be spaced apart from each other on a part of the second planarization layer 116b having a smaller thickness formed by a halftone mask process.

The bank BB may be formed of an opaque material to reduce color mixture between the plurality of sub pixels SP and, for example, may be formed of black resin, but is not limited thereto.

In the meantime, a thickness of a part of the bank BB which covers a part of the second connection electrode CE2 formed in the contact holes of the third planarization layer 116c and the second planarization layer 116b may be different from a thickness of a part of the bank BB disposed on the second planarization layer 116b. Specifically, where the part of the bank BB covers a part of the second connection electrode CE2 formed in the contact holes of the third planarization layer 116c and the second planarization layer 116b, since the contact hole is formed from the second passivation layer 115b to the third planarization layer 116c, this part of the bank BB may be disposed below the light emitting diode 130, that is, disposed to be lower than the light emitting diode 130. Therefore, the thickness of the part of the bank BB which covers a part of the second connection electrode CE2 formed in the contact holes of the third planarization layer 116c and the second planarization layer 116b may be larger than the thickness of a part of the bank BB disposed on the second planarization layer 116b.

A first protection layer 117 may be disposed on the first connection electrode CE1, the second connection electrode CE2, and the bank BB. The first protection layer 117 is a layer for protecting components below the first protection layer 117 and may be configured by a single layer or a double layer of translucent epoxy, silicon oxide SiOx or silicon nitride SiNx, but is not limited thereto.

A plurality of first pad electrodes PAD1 may be disposed in a first pad area PA1 and a second pad area PA2 of the first substrate 110. Each of the plurality of first pad electrodes PAD1 may be configured by a plurality of conductive layers. For example, each of the plurality of first pad electrodes PAD1 may include a first conductive layer PE1a, a second conductive layer PE1b, and a third conductive layer PE1c.

First, the first conductive layer PE1a may be disposed on the second interlayer insulating layer 114. The first conductive layer PE1a may be formed of the same conductive material as the source electrode SE and the drain electrode DE and, for example, may be configured by copper (Cu), aluminum (Al), molybdenum (Mo), nickel (Ni), titanium (Ti), chrome (Cr), or an alloy thereof, but is not limited thereto.

The first passivation layer 115a may be disposed on the first conductive layer PE1a, and the second conductive layer PE1b is disposed on the first passivation layer 115a. The second conductive layer PE1b may be formed of the same conductive material as the reflection plate RF and, for example, may be configured by silver (Ag), aluminum (Al), molybdenum (Mo), or an alloy thereof, but is not limited thereto.

The third conductive layer PE1$c$ may be disposed on the second conductive layer PE1$b$. The third conductive layer PE1$c$ may be formed of the same conductive material as the first connection electrode CE1 and the second connection electrode CE2, and for example, may be formed of a transparent conductive material, such as indium tin oxide (ITO) or indium zinc oxide (IZO), but is not limited thereto.

Here, even though not illustrated in the drawings, a part of the plurality of conductive layers of the first pad electrode PAD1 may be electrically connected to a plurality of wiring lines on the first substrate 110 to supply various signals to a plurality of wiring lines and a plurality of sub pixels SP. For example, the first conductive layer PE1$a$ and/or the second conductive layer PE1$b$ of the first pad electrode PAD1 may be connected to the data line DL, the high potential power line VL1, the low potential power line VL2, and the like disposed in the active area AA to transmit signals thereto.

A first metal layer ML1, a second metal layer ML2, and a plurality of insulating layers may be disposed together below the first pad electrode PAD1. The first metal layer ML1, the second metal layer ML2, and the plurality of insulating layers are disposed below the first pad electrode PAD1 to adjust a step of the first pad electrode PAD1. For example, the buffer layer 111, the gate insulating layer 112, the first metal layer ML1, the first interlayer insulating layer 113, and the second metal layer ML2 may be sequentially disposed between the first pad electrode PAD1 and the first substrate 110. The first metal layer ML1 may be formed of the same conductive material as the gate electrode GE, and the second metal layer ML2 may be formed of the same conductive material as the 1-2-th capacitor electrode C1$b$. However, the plurality of insulating layers, the first metal layer, and the second metal layer below the first pad electrode PAD1 may be omitted depending on a design employed and are not limited thereto.

A second substrate 120 may be disposed below the first substrate 110. The second substrate 120 is a substrate which may support components disposed below the display device 100 and may be an insulating substrate. For example, the second substrate 120 may be formed of glass, resin, or the like, but is not limited thereto. Further, the second substrate 120 may include polymer or plastic, but is not limited thereto. The second substrate 120 may be formed of the same material as the first substrate 110. In some example embodiments, the second substrate 120 may be formed of a plastic material having flexibility.

A bonding layer BDL may be disposed between the first substrate 110 and the second substrate 120. The bonding layer BDL may be formed of a material which is cured by various curing methods to bond the first substrate 110 and the second substrate 120. The bonding layer BDL may be disposed only in a partial area between the first substrate 110 and the second substrate 120 or may be disposed in the entire area therebetween.

A plurality of second pad electrodes PAD2 may be disposed on a rear surface of the second substrate 120. The plurality of second pad electrodes PAD2 may be electrodes for transmitting a signal from a driving component disposed on the rear surface of the second substrate 120 to a plurality of side lines SRL and to a plurality of first pad electrodes PAD1 and a plurality of wiring lines on the first substrate 110. The plurality of second pad electrodes PAD2 may be disposed in an end portion of the second substrate 120 in the non-active area NA to be electrically connected to the side lines SRL which cover the end portion of the second substrate 120.

Here, the plurality of second pad electrodes PAD2 may also be disposed to correspond to the plurality of pad areas PA1 and PA2. The plurality of first pad electrodes PAD1 may be disposed to correspond to the plurality of second pad electrodes PAD2, respectively, and then a first pad electrode PAD1 and a second pad electrode PAD2 which overlap each other may be electrically connected through a side line SRL.

Each of the plurality of second pad electrodes PAD2 may include a plurality of conductive layers. For example, each of the plurality of second pad electrodes PAD2 may include a fourth conductive layer PE2$a$, a fifth conductive layer PE2$b$, and a sixth conductive layer PE2$c$.

First, the fourth conductive layer PE2$a$ may be disposed under the second substrate 120. The fourth conductive layer PE2$a$ may be configured by a conductive material, such as copper (Cu), aluminum (Al), molybdenum (Mo), nickel (Ni), titanium (Ti), chrome (Cr), or an alloy thereof, but is not limited thereto.

The fifth conductive layer PE2$b$ may be disposed under the fourth conductive layer PE2$a$. The fifth conductive layer PE2$b$ may be configured by a conductive material, such as copper (Cu), aluminum (Al), molybdenum (Mo), nickel (Ni), titanium (Ti), chrome (Cr), or an alloy thereof, but is not limited thereto.

The sixth conductive layer PE2$c$ may be disposed under the fifth conductive layer PE2$b$. The sixth conductive layer PE2$c$ may be formed of a conductive material, for example, a transparent conductive material, such as indium tin oxide (ITO) or indium zinc oxide (IZO), but is not limited thereto.

The second protection layer 121 may be disposed in the remaining area of the second substrate 120. The second protection layer 121 may protect various wiring lines and driving components (not illustrated) formed on the second substrate 120. The second protection layer 121 may be configured by an organic insulating material and, for example, may be configured by benzocyclobutene or an acrylic organic insulating material, but is not limited thereto.

In the meantime, even though not illustrated in the drawing, a driving component including a plurality of flexible films and a printed circuit board may be disposed on a rear surface of the second substrate 120. The plurality of flexible films may be components in which various components such as a data driver IC are disposed on a base film having a ductility to supply signals to the plurality of sub pixels SP. The printed circuit board may be a component electrically connected to the plurality of flexible films to supply signals to the driving IC. On the printed circuit board, various components for supplying various signals to the driving IC may be disposed.

For example, the fourth conductive layer PE2$a$ and/or the fifth conductive layer PE2$b$ of the second pad electrodes PAD2 may extend to the plurality of flexible films disposed on the rear surface of the second substrate 120 to be electrically connected to the plurality of flexible films. The plurality of flexible films may supply various signals to the plurality of side lines SRL, the plurality of first pad electrodes PAD1, the plurality of wiring lines, and the plurality of sub pixels SP through the second pad electrodes PAD2. Therefore, the signals from the driving component may be transmitted to the signal lines and the plurality of sub pixels SP on the front surface of the first substrate 110 through the plurality of second pad electrodes PAD2 of the second substrate 120, the side lines SRL, and the plurality of first pad electrodes PAD1 of the first substrate 110.

Next, the plurality of side lines SRL may be disposed on the side surfaces of the first substrate 110 and the second substrate 120. The plurality of side lines SRL may electrically connect the plurality of first pad electrodes PAD1 formed on the top surface of the first substrate 110 respectively to the plurality of second pad electrodes PAD2 formed on the rear surface of the second substrate 120. The plurality of side lines SRL may be disposed to enclose the side surface of the display device 100. Each of the plurality of side lines SRL may cover the first pad electrode PAD1 at an end portion of the first substrate 110, a side surface of the first substrate 110, a side surface of the second substrate 120, and the second pad electrode PAD2 at an end portion of the second substrate 120. For example, the plurality of side lines SRL may be formed by a pad printing method using a conductive ink, for example, including silver (Ag), copper (Cu), molybdenum (Mo), chrome (Cr), and the like, but are not limited thereto.

A side insulating layer 140 may be disposed to cover the plurality of side lines SRL. The side insulating layer 140 may be formed on the top surface of the first substrate 110, the side surface of the first substrate 110, the side surface of the second substrate 120, and the rear surface of the second substrate 120 to cover the side lines SRL. The side insulating layer 140 may protect the plurality of side lines SRL.

In the meantime, where the plurality of side lines SRL is formed of a metal material, there may be a potential problem in that external light or light emitted from the light emitting diodes 130 may be reflected from the plurality of side lines SRL to be visibly recognizable by the user. Therefore, the side insulating layer 140 may be configured to include a black material to suppress reflection of the external light or the light emitted from the light emitting diodes 130. For example, the side insulating layer 140 may be formed by a pad printing method using an insulating material including a black material, for example, a black ink, but is not limited thereto.

A seal member 150 may be disposed to cover the side insulating layer 140. The seal member 150 may be disposed to enclose the side surface of the display device 100 to protect the display device 100 from external impacts, moisture and oxygen, or the like. For example, the seal member 150 may be formed of polyimide (PI), poly urethane, epoxy, or acryl based insulating material, but is not limited thereto.

An optical film MF may be disposed on the seal member 150, the side insulating layer 140, and the first protection layer 117. The optical film MF may be a functional film which implements a higher quality of images while protecting the display device 100. For example, the optical film MF may include an anti-scattering film, an anti-glare film, an anti-reflecting film, a low-reflecting film, an OLED (organic light emitting diode) transmittance controllable film, a polarizer, or the like, but is not limited thereto.

In the meantime, an edge of the seal member 150 and an edge of the optical film MF may be disposed along the same line or to be aligned at an edge. The optical film MF having a larger size may be attached above the first substrate 110 during the manufacturing process of the display device 100, and the seal member 150 may be formed to cover the side insulating layer 140. Thereafter, laser may be irradiated on the seal member 150 and the optical film MF to correspond to an edge of the display device 100 to cut a part of the seal member 150 and the optical film MF. Accordingly, the size of the display device 100 may be adjusted by an outer periphery cutting process of the seal member 150 and the optical film MF, and the edge of the display device 100 may be formed to be flat.

Hereinafter, a mechanical structure of the display device 100 according to an example embodiment of the present disclosure will be described with reference to FIGS. 5 to 8.

Figure 5:
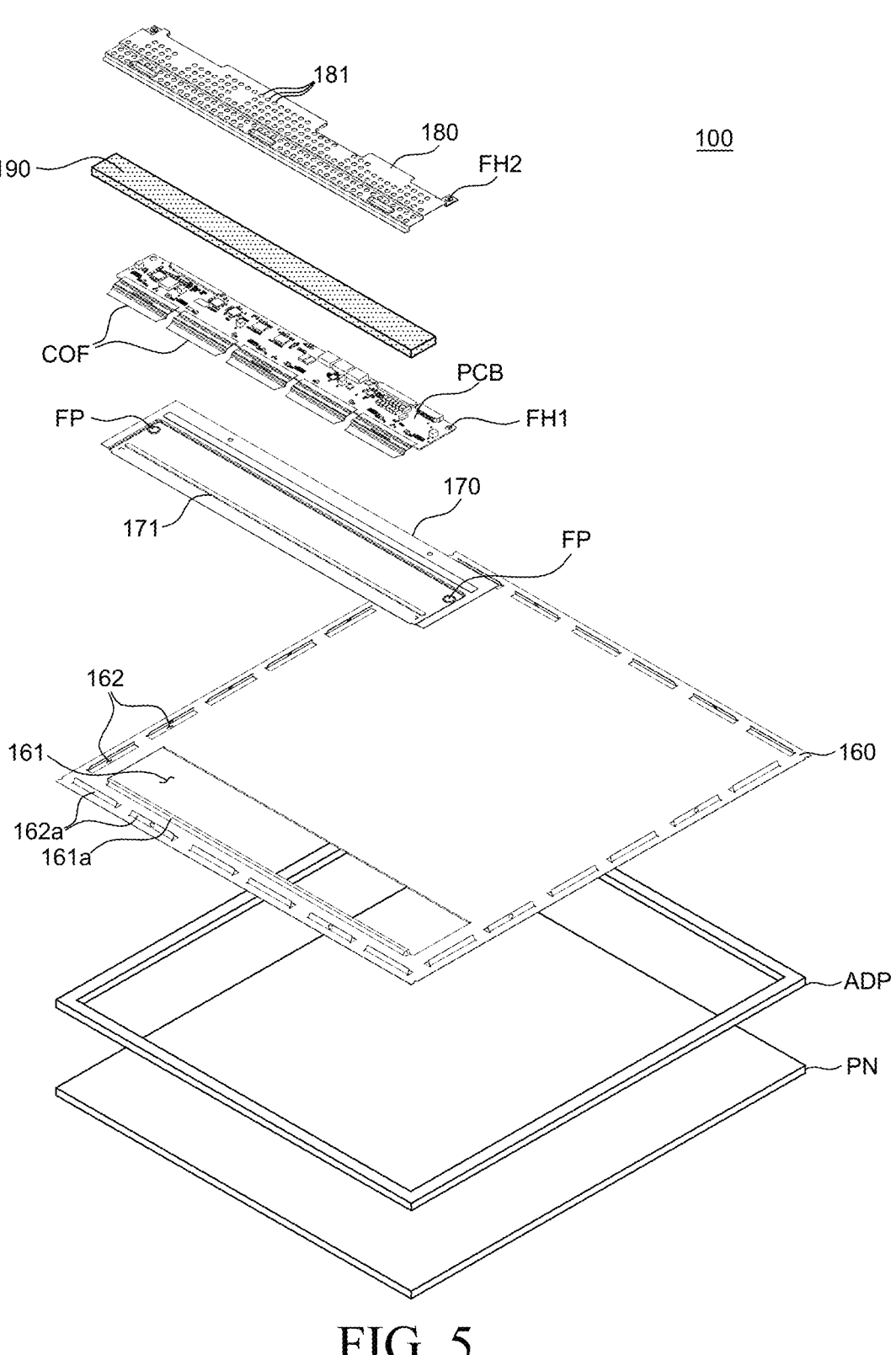
FIG. 5 is an exploded perspective view of a display device according to an example embodiment of the present disclosure.
Figure 6:
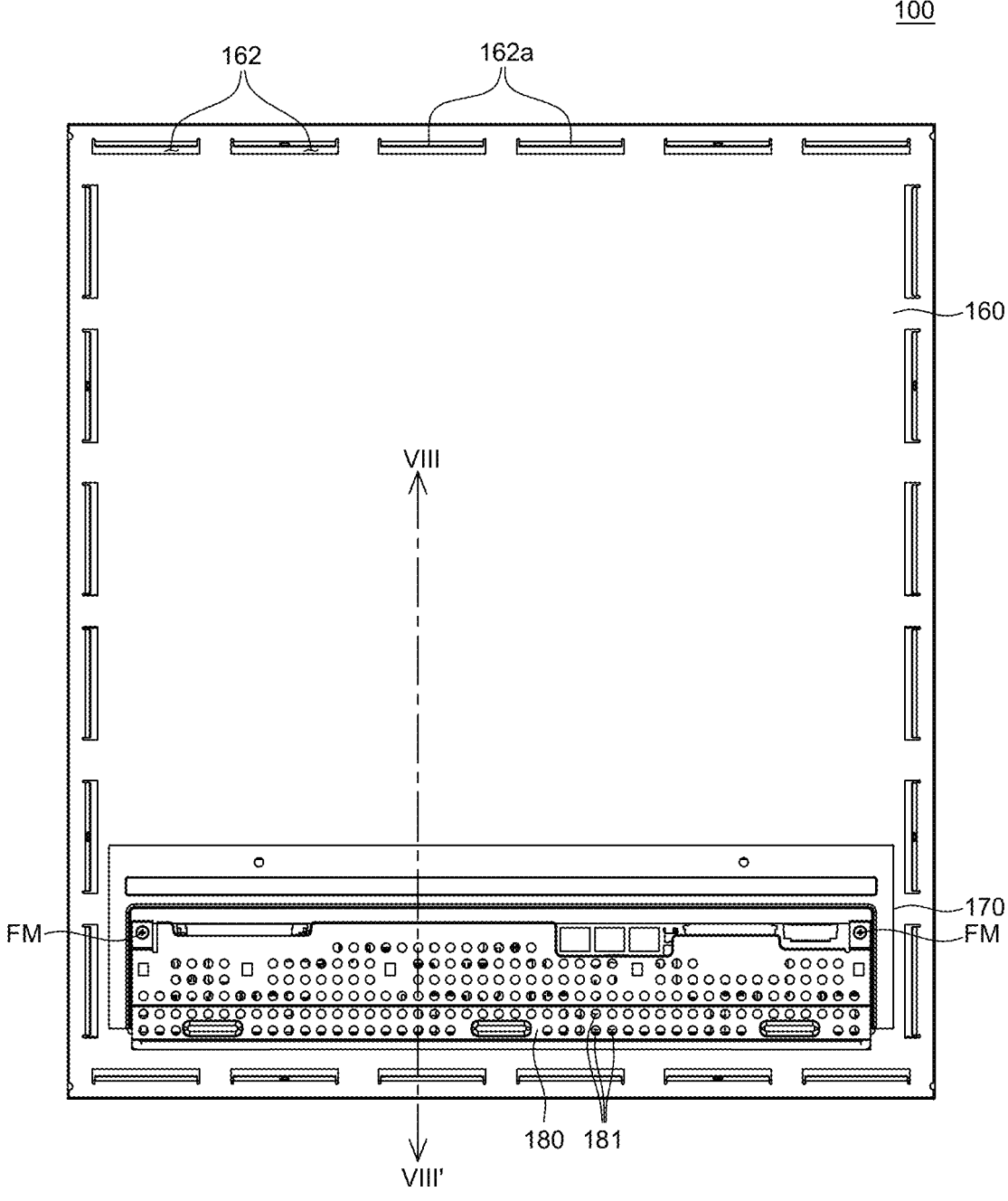
FIG. 6 is a rear view of a display device according to an example embodiment of the present disclosure.
Figure 7:
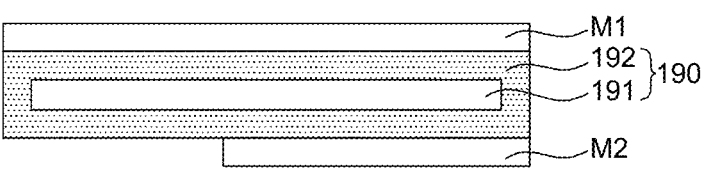
FIG. 7 is a cross-sectional view of a heat dissipation unit of a display device according to an example embodiment of the present disclosure.
Figure 8:
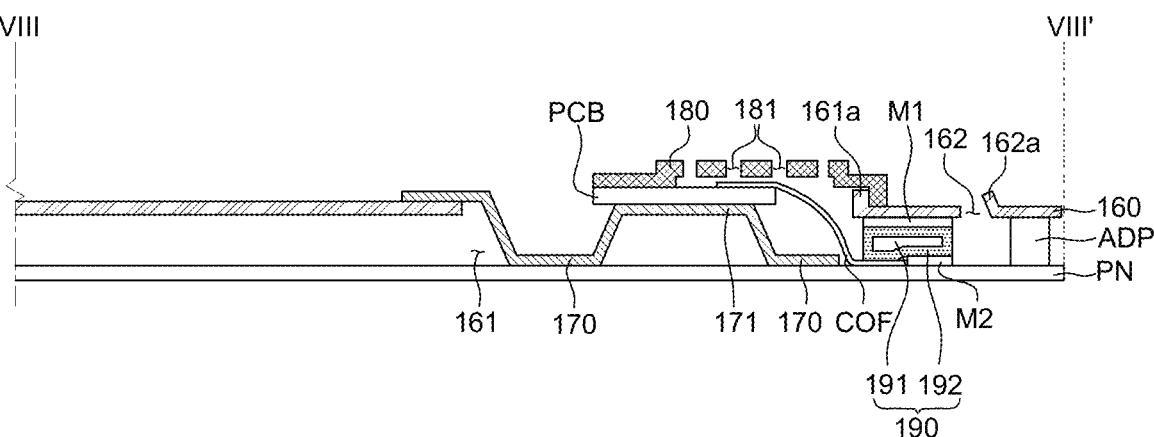
FIG. 8 is an example cross-sectional view taken along the line VIII-VIII' of FIG. 6.

FIG. 5 is an exploded perspective view of a display device according to an example embodiment of the present disclosure. FIG. 6 is a rear view of a display device according to an example embodiment of the present disclosure. FIG. 7 is a cross-sectional view of a heat dissipation unit of a display device according to an example embodiment of the present disclosure. FIG. 8 is an example cross-sectional view taken along the line VIII-VIII' of FIG. 6.

As shown in FIG. 5, the display device 100 according to an example embodiment of the present disclosure may include a display panel PN, a plurality of flexible films COF, a printed circuit board PCB, a cover bottom 160, a plate bottom 170, a cover shield 180, and an adhesive member ADP.

A plurality of flexible films COF may be bonded onto a rear surface of the display panel PN. The plurality of flexible films COF may be electrically connected to the plurality of second pad electrodes PAD2 of the second substrate 120 of the display panel PN. The flexible film COF may be a film in which various components are disposed on a base film having a ductility to supply a signal to the sub pixel SP and a driving component and may be electrically connected to the display panel PN.

A driving IC, such as a gate driver IC or a data driver IC, may be disposed on the plurality of flexible films COF. The driving IC is a component which may be configured to process data for displaying images and a driving signal for processing the data. The driving IC may be disposed in a chip on glass (COG), a chip on film (COF), or a tape carrier package (TCP) manner depending on a mounting method employed. However, for the convenience of description, the driving IC is described as mounted on the plurality of flexible films COF by a chip on film technique as an example, but is not limited thereto.

The printed circuit board PCB may be electrically connected to the plurality of flexible films COF. The printed circuit board PCB is a component which may be configured to supply signals to the driving IC. On the printed circuit board PCB, various components for supplying various signals to the driving IC may be disposed.

In the meantime, even though FIG. 5 illustrates five flexible films COF and one printed circuit board PCB as an example, the number of flexible films COF and printed circuit boards PCB may vary depending on a design and is not limited thereto.

The printed circuit board PCB may include a first fastening hole FH1. A fastening member FM (see, for example, FIG. 6) may be inserted into the first fastening hole FH1 formed in the printed circuit board PCB so that the printed circuit board PCB and the plate bottom 170 and the cover shield 180 may be fastened with one another.

The heat dissipation unit 190 may be disposed to overlap the plurality of flexible films COF between the cover bottom 160 and the display panel PN. Further, the heat dissipation unit 190 may be disposed to overlap the display panel PN at the outside of the flexible film COF. Therefore, the entire top surface of the heat dissipation unit 190 may be disposed to overlap the cover bottom 160.

The heat dissipation unit 190 (see, e.g., FIG. 7) may include an elastic member 191 and a heat dissipation member 192 disposed to enclose the elastic member 191. That is, the heat dissipation member 192 may enclose a side surface, a bottom surface, and a top surface of the elastic member 191.

The heat dissipation unit 190 may be disposed to extend in a direction corresponding to a length direction of the printed circuit board PCB. Therefore, as illustrated in FIG.

5, the heat dissipation unit 190 may be disposed to have a long axis in a length direction of the printed circuit board PCB.

The elastic member 191 may have an elastic force to push the heat dissipation member 192 toward the cover bottom 160 and the display panel PN. For example, the elastic member 191 may be formed of a foam tape but is not limited thereto.

The heat dissipation member 192 may be formed of a material having a high thermal conductivity. For example, the heat dissipation member 192 may be formed of one of graphite, aluminum (Al), and copper (Cu), but is not limited thereto.

A first member M1 and a second member M2 may be disposed respectively on a top surface and a bottom surface of the heat dissipation unit 190. For example, the first member M1 and the second member M2 may be double-sided tapes but are not limited thereto.

The first member M1 may bond the heat dissipation unit 190 and the cover bottom 160. The first member M1 may be disposed to overlap the entire surface of the heat dissipation unit 190. Therefore, the heat dissipation unit 190 may be disposed to be in close contact with one surface of the cover bottom 160.

The second member M2 may bond the heat dissipation unit 190 and the display panel PN. The second member M2 may be disposed to overlap a part of the heat dissipation unit 190. For example, if the heat dissipation unit 190 is disposed to overlap the display panel PN at the outside of the plurality of flexible films COF, the second member M2 may be spaced apart from the plurality of flexible films COF to overlap the display panel PN. For example, the plurality of flexible films COF may be disposed to be more adjacent to a center portion of the display panel PN than the second member M2, and the second member M2 may be disposed to be more adjacent to the edge of the display panel PN than the plurality of flexible films COF.

A separate adhesive member may not be disposed between the plurality of flexible films COF and the heat dissipation unit 190. Therefore, the plurality of flexible films COF and the heat dissipation unit 190 may be in a non-bonded state.

In the meantime, before being disposed between the cover bottom 160 and the display panel PN, as illustrated in FIG. 7, the heat dissipation unit 190 may be configured with a flat bottom surface formed to have a step shape. The elastic member 191 of the heat dissipation unit 190 may have an elasticity to fill spaces disposed above and below the heat dissipation unit 190. Therefore, when the heat dissipation unit 190 is disposed above the plurality of flexible films COF and the second member M2, the elastic member 191 may push the heat dissipation member 192 toward the plurality of flexible films COF and the second member M2. Accordingly, even though a step is generated on the top surface of the flexible film COF and the top surface of the second member M2 as illustrated in FIG. 8, the bottom surface of the heat dissipation member 192 may be disposed to be in contact with the top surfaces of the plurality of flexible films COF. In the meantime, even though the thickness of the second member M2 is illustrated to be larger than the thickness of the plurality of flexible films COF in FIG. 8 as an example, the thickness of the second member M2 and the thickness of the plurality of flexible films COF are not limited thereto.

The cover bottom 160 may be disposed on a rear surface of the display panel PN. The cover bottom 160 may support and protect the display panel PN on the rear surface of the display panel PN and may be disposed to be in close contact with the heat dissipation member 192 of the heat dissipation unit 190 with the first member M1 therebetween. The cover bottom 160 may be formed to have a shape corresponding to a planar shape of the display panel PN to cover the display panel PN. The cover bottom 160 may be formed of a material having a rigidity and a high thermal conductivity and, for example, may be formed of a metal material, such as aluminum (Al), copper (Cu), zinc (Zn), silver (Ag), gold (Au), iron (Fe), steel use stainless (SUS), or invar, or a plastic material.

The cover bottom 160 may include a first opening 161 and a plurality of second openings 162.

The first opening 161 of the cover bottom 160 may be disposed to correspond to the plurality of flexible films COF and the printed circuit board PCB. The first opening 161 may be located in an area of the display panel to which the plurality of flexible films COF are bonded. For example, the plurality of flexible films COF may be bonded to an area adjacent to one edge of the display panel PN, and the first opening 161 may be also formed to correspond to an area adjacent to the one edge of the display panel PN.

The plurality of flexible films COF and the printed circuit board PCB may pass through the first opening 161 to be disposed in the first opening 161 of the cover bottom 160. Therefore, the plurality of flexible films COF and the printed circuit board PCB may be disposed in the first opening 161 of the cover bottom 160 without a separate area being provided for disposing the plurality of flexible films COF and the printed circuit board PCB between the cover bottom 160 and the display panel PN. Here, the plate bottom 170 may be seated in the first opening 161 of the cover bottom 160 to support the printed circuit board PCB, which will be described in more detail below.

A first protrusion 161a may be disposed at an edge of the first opening 161. The first protrusion 161a may be disposed at one long edge adjacent to the one edge of the display panel PN, among edges of the first opening 161. The first protrusion 161a may be disposed at an edge most adjacent to a lower edge of the display panel PN, among edges of the first opening 161. The first protrusion 161a may be disposed to protrude toward a direction perpendicular to the rear surface of the cover bottom 160 from one long edge of the first opening 161. The first protrusion 161a may be engaged with the cover shield 180, which will be described later, to restrict the movement of the cover shield 180 and to guide a position of the cover shield 180.

Next, the plurality of second openings 162 of the cover bottom 160 may be disposed along an edge of the cover bottom 160. The plurality of second openings 162 may be disposed to be parallel to the edge of the cover bottom 160. The plurality of second openings 162 may be formed when the plurality of second protrusions 162a are formed.

The plurality of second protrusions 162a may be parts for coupling the display device 100 to a cabinet. The plurality of second protrusions 162a may be used to fix the display device 100 to the cabinet in the form of a tile to form a tiling display device TD (see, e.g., FIG. 2B). The plurality of second protrusions 162a may protrude from one edges of the plurality of second openings 162 away from the rear surface of the cover bottom 160. The plurality of second protrusions 162a may be formed by bending a part of the cover bottom 160 in a direction perpendicular to the rear surface of the cover bottom 160 and may have an L-shaped cross-section.

The second protrusions 162a may be formed by cutting and bending parts of the cover bottom 160. Therefore, when the plurality of second protrusions 162a is formed, the plurality of second openings 162 may be formed in parts where the cover bottom 160 is cut. Therefore, the second protrusions 162a may be disposed on the edges of the plurality of second openings 162. For example, a second protrusion 162a may be disposed on an edge of a second opening 162 which is parallel to an edge of the cover bottom 160.

In the meantime, the display panel PN and the cover bottom 160 may be connected by means of the adhesive member ADP formed along the edge of the cover bottom 160.

The plate bottom 170 may be disposed between the printed circuit board PCB and the first opening 161 of the cover bottom 160. A part of the plate bottom 170 may cover the other long edge of the first opening 161 and the cover bottom 160, and the other part of the plate bottom 170 may be disposed in the first opening 161. The plate bottom 170 may pass through the first opening 161 to support the printed circuit board PCB disposed on the cover bottom 160. For example, as illustrated in FIG. 8, the plate bottom 170 may be disposed to be in contact with the display panel PN at an area not overlapping the printed circuit board PCB and may be spaced apart from the display panel PN in an area overlapping the printed circuit board PCB to support the printed circuit board PCB.

The plate bottom 170 may extend to the outside of the first opening 161 to overlap the rear surface of the cover bottom 160. For example, the plate bottom 170 may extend toward the center portion of the display panel PN from the first opening 161 to overlap the rear surface of the cover bottom 160.

Here, an area of the display panel PN to which one ends of the plurality of flexible films COF are bonded may be a partial area of the first opening 161 which does not overlap the plate bottom 170. One ends of the plurality of flexible films COF may overlap the first opening 161 and may be disposed to be spaced apart from the plate bottom 170.

The plate bottom 170 may disperse and dissipate the heat generated in the printed circuit board PCB. The plate bottom 170 does not allow the printed circuit board PCB to be in direct contact with the display panel PN to minimize the concentration of the heat from the printed circuit board PCB on a specific area of the display panel PN. Specifically, the printed circuit board PCB may include a plurality of components, including some driving chips which may generate a significant amount of heat may be disposed. The plate bottom 170 may disperse the heat generated in some driving chips of the printed circuit board PCB to the entire plate bottom 170 so as not to concentrate the heat on a partial area of the display panel PN adjacent to the driving chip, thereby reducing the entire temperature deviation of the display panel PN.

The plate bottom 170 may include a bead 171. The bead 171 is a part protruding from one surface of the plate bottom 170 toward the printed circuit board PCB and may improve the rigidity of the plate bottom 170 while supporting the printed circuit board PCB. The bead 171 may be in direct contact with the printed circuit board PCB, and heat generated in the printed circuit board PCB may be dispersed to the entire plate bottom 170 through the bead 171.

The plate bottom 170 may include a fastening unit FP. The fastening unit FP is a part to which the fastening member FM passing through the first fastening hole FH1 of the printed circuit board PCB and the second fastening hole FH2 of the cover shield 180 may be coupled. The fastening member FM may be coupled to the fastening unit FP to fix the plate bottom 170, the printed circuit board PCB, and the cover shield 180 to one another. For example, the fastening unit FP may be a Pem-nut having a groove with a thread of a screw therein but is not limited thereto.

Next, a cover shield 180 may be disposed on the cover bottom 160, the plate bottom 170, and the printed circuit board PCB. The cover shield 180 may protect the printed circuit board PCB from the external impact. The cover shield 180 may be formed of a material having a rigidity to protect the printed circuit board PCB but is not limited thereto.

The cover shield 180 may be disposed on the rear surface of the cover bottom 160 to cover the printed circuit board PCB. One edge of the cover shield 180 may be bent toward the cover bottom 160 to be in contact with an outer side surface of the first protrusion 161a. For example, one edge of the cover shield 180 may be bent in a reversed L-shape and may be in contact with the outer side surface of the first protrusion 161a of the cover bottom 160. Therefore, the first protrusion 161a and one side portion of the cover shield 180 may be engaged with each other to restrict the movement of the cover shield 180 and to guide the position of the cover shield 180.

The cover shield 180 may include a plurality of heat dissipation holes 181. The plurality of heat dissipation holes 181 may be disposed in most areas of the cover shield 180 as illustrated in FIG. 6. The plurality of heat dissipation holes 181 may be formed to dissipate the heat generated in the printed circuit board PCB to the exterior of the cover shield 180. Some driving chips which generate a significant amount of heat, among the plurality of components of the printed circuit board PCB, may be exposed from the cover shield 180. Some driving chips which generate a significant amount of heat may be exposed from the cover shield 180 to efficiently dissipate heat generated in the driving chips. Therefore, additional grooves or holes may be formed in parts of the cover shield 180 according to positions of the driving chips which may generate a significant amount of heat.

The cover shield 180 may include a plurality of second fastening holes FH2. A fastening member FM may be inserted into the second fastening hole FH2 to fix the cover shield 180 to the printed circuit board PCB and the plate bottom 170. Specifically, the cover shield 180 and the printed circuit board PCB may be fixed to the plate bottom 170 by coupling the fastening member FM passing through both the second fastening hole FH2 of the cover shield 180 and the first fastening hole FH1 of the printed circuit board PCB to the fastening unit FP of the plate bottom 170. For example, the fastening member FM may be a bolt screwed to the fastening unit FP, which may be a nut, but is not limited thereto.

Next, an adhesive member ADP may be disposed between the cover bottom 160 and the display panel PN. The adhesive member ADP may be formed of a material with adhesiveness to fix the cover bottom 160 onto the rear surface of the display panel PN. The adhesive member ADP may be disposed along one or more edges of the display panel PN and one or more edges of the cover bottom 160. The adhesive member ADP may be formed in a frame shape corresponding to edges of the display panel PN. For example, the adhesive member ADP may be a foam tape having adhesiveness but is not limited thereto.

The adhesive member ADP may be disposed to be adjacent to the edge(s) of the cover bottom 160.

Various chips for driving the display device may be disposed on the printed circuit board PCB of the display device. For example, on the printed circuit board PCB, an element used to generate various voltages, such as a high potential power, a low potential power, and a reference power, that is, an IC chip may be disposed. In the meantime, when the display device is driven, chips disposed on the printed circuit board may generate heat. Specifically, a chip, such as an IC FET or a buck IC configured to generate a high potential voltage, like a power management integrated circuit (PMIC), may generate the highest amount of heat, among various chips disposed on the printed circuit board. Therefore, heat may be concentrated in an area in which the printed circuit board PCB is disposed, for example, in a lower end area of the display panel PN so that entire temperature deviation of the display panel PN may be increased. When there is a temperature deviation in each area of the display panel, spots may be seen from the display panel, a color difference may occur, or a display quality may be degraded.

Accordingly, in the display device 100 according to an example embodiment of the present disclosure, the heat dissipation unit 190 may be disposed in a specific area of the display panel PN in which a high temperature may be caused, for example, in a lower end area of the display panel PN where the printed circuit board PCB disposed, to reduce the entire temperature deviation of the display panel PN. The heat dissipation unit 190 may be disposed to be in close contact with the display panel PN and the plurality of flexible films COF, and in contact with the cover bottom 160 via the first member M1 to reduce the transmission of heat generated in the printed circuit board PCB to the display panel PN, thereby uniformly implementing the entire temperature of the display panel PN. For example, the heat dissipation unit 190 may vertically transmit heat generated in the lower end area of the display panel PN by the printed circuit board PCB to transmit the heat to the cover shield 180. Therefore, the overall temperature of the display panel PN may be uniformly implemented by increasing a heat transfer amount of the display device 100 to minimize spots or color differences and improve the display quality.

Further, in the display device 100 according to an example embodiment of the present disclosure, the heat dissipation unit 190 including the elastic member 191 and the heat dissipation member 192 enclosing the elastic member 191 may be disposed. Therefore, the heat transfer efficiency generated in the lower end area of the display panel PN may be improved. The elastic member 191 may have a force pushing in a direction opposite to an applied force. Therefore, if the heat dissipation unit 190 is disposed above and/or below the component in which a step is generated, the elastic member 191 and the heat dissipation member 192 may fill a space created by the step. For example, if a top surface of the second member M2 disposed below the heat dissipation unit 190 is disposed to be higher than the top surface of the plurality of flexible films COF, the heat dissipation unit 190 may fill the space between the second member M2 and the plurality of flexible films COF. Accordingly, the heat dissipation unit 190 may be disposed to be in close contact with the top surfaces of the plurality of flexible films COF and the top surface of the second member M2 and may transmit heat generated in a lower end area of the display panel PN in a vertical direction to be transmitted to the cover shield 180. Accordingly, the heat transfer amount may be increased to uniformly implement the overall temperature of the display panel PN.

Further, in the display device 100 according to an example embodiment of the present disclosure, the plurality of flexible films COF and the heat dissipation unit 190 may be disposed in a non-bonded state to reduce the risk of breakage of the plurality of flexible films COF. The second member M2 disposed on the bottom surface of the heat dissipation unit 190 may be disposed at the exterior of the plurality of flexible films COF. For example, the second member M2 may be in contact with the display panel PN at the exterior of the plurality of flexible films COF and bond the display panel PN and the heat dissipation unit 190. In contrast, the second member M2 with the adhesiveness is not disposed above the flexible film COF so that the risk of breakage due to the external force may be reduced.

Further, the flexible films COF and the printed circuit board PCB may need to be separated from the display panel PN during a repair process after the display device 100 is manufactured. Therefore, in the display device 100 according to an example embodiment of the present disclosure, the second member M2 may not be bonded to the flexible film COF. Accordingly, a potential problem of the flexible film COF not easily peeling off from the display panel PN during the repair process or a potential damage to the flexible film COF or the display panel PN during the process of peeling off the flexible films COF may be suppressed with the use of the second member M2.

Various example embodiments of the present disclosure can also be described as follows:

According to an aspect of the present disclosure, a display device may include a display panel; a cover bottom on a rear surface of the display panel and including a first opening; a plate bottom on the rear surface of the display panel and overlapping the first opening; a printed circuit board on a rear surface of the plate bottom and connected to the display panel; a plurality of flexible films connecting the printed circuit board and the display panel; and a heat dissipation unit disposed between the display panel and the cover bottom. The heat dissipation unit may overlap the plurality of flexible films.

In some embodiments, the heat dissipation unit may include an elastic member and a heat dissipation member enclosing the elastic member.

In some embodiments, the display device may further include: a first member bonding the heat dissipation unit and the cover bottom; and a second member bonding the heat dissipation unit and the display panel.

In some embodiments, a front surface of the heat dissipation unit may be in contact with respective rear surfaces of the plurality of flexible films.

In some embodiments, the first member may overlap the heat dissipation unit, and the second member may be spaced apart from the plurality of flexible films and overlap a part of the heat dissipation unit.

In some embodiments, the plurality of flexible films may be closer to a center portion of the display panel than the second member is.

In some embodiments, the plurality of flexible films may not be bonded to the heat dissipation unit.

In some embodiments, the elastic member may have an elastic force pushing the heat dissipation member toward the cover bottom and the display panel.

In some embodiments, the heat dissipation member may be formed of one of graphite, aluminum (Al), and copper (Cu), and the elastic member may be formed of a foam tape.

In some embodiments, the heat dissipation unit may extend in a direction corresponding to a length direction of the printed circuit board.

In some embodiments, the display device may further include a cover shield covering the printed circuit board and in contact with a rear surface of the cover bottom.

In some embodiments, the heat dissipation unit may at least partially overlap the cover shield.

In some embodiments, the cover bottom may further include a first protrusion along an edge of the first opening and protruding away from the display panel, and the cover shield may include a bent edge engaged with the first protrusion of the cover bottom.

In some embodiments, the plate bottom may include a portion protruding away from the rear surface of the display panel, and the printed circuit board may be disposed on the portion of the plate bottom protruding away from the rear surface of the display panel.

According to another aspect of the present disclosure, a display device may include: a display panel; a cover bottom on a rear surface of the display panel and including a first opening; a plurality of flexible films, each passing through the first opening and having one end connected to the display panel; and a heat dissipation unit disposed between the display panel and the cover bottom. A front surface of the heat dissipation unit may be in contact with a rear surface of the one end of at least one of the plurality of flexible films.

In some embodiments, the heat dissipation unit may include an elastic member and a heat dissipation member enclosing the elastic member.

In some embodiments, the display device may further include a first member bonding the heat dissipation unit to the cover bottom, and a second member bonding the heat dissipation unit to the display panel.

In some embodiments, the first member may overlap the heat dissipation unit in a plan view, and the second member may be spaced apart from the plurality of flexible films and may overlap a part of the heat dissipation unit in the plan view.

In some embodiments, each of the plurality of flexible films may further include another end connected to a printed circuit board, and the plurality of flexible films may be closer to a center portion of the display panel than the second member is in the plan view.

In some embodiments, the plurality of flexible films may not be bonded to the heat dissipation unit.

It will be apparent to those skilled in the art that the present disclosure is not limited by the above-described example embodiments and the accompanying drawings, and that various substitutions, modifications, and variations can be made in the present disclosure without departing from the spirit or scope of the disclosures. Therefore, the above example embodiments of the present disclosure are provided for illustrative purposes and are not intended to limit the scope or technical concept of the present disclosure. The protective scope of the present disclosure should be construed based on the following claims and their equivalents, and it is intended that the present disclosure cover all modifications and variations of this disclosure that come within the scope of the claims and their equivalents.

What is claimed is:

1. A display device, comprising:
a display panel;
a cover bottom on a rear surface of the display panel and including a first opening;
a plate bottom on the rear surface of the display panel and overlapping the first opening;
a printed circuit board on a rear surface of the plate bottom and connected to the display panel;
a plurality of flexible films connecting the printed circuit board and the display panel; and
a heat dissipation unit disposed between the display panel and the cover bottom, wherein the heat dissipation unit overlaps the plurality of flexible films.

2. The display device of claim 1, wherein the heat dissipation unit includes an elastic member and a heat dissipation member enclosing the elastic member.

3. The display device of claim 2, further comprising:
a first member bonding the heat dissipation unit and the cover bottom; and
a second member bonding the heat dissipation unit and the display panel.

4. The display device of claim 3, wherein a front surface of the heat dissipation unit is in contact with respective rear surfaces of the plurality of flexible films.

5. The display device of claim 3, wherein:
the first member overlaps the heat dissipation unit; and
the second member is spaced apart from the plurality of flexible films and overlaps a part of the heat dissipation unit.

6. The display device of claim 5, wherein the plurality of flexible films are closer to a center portion of the display panel than the second member is.

7. The display device of claim 5, wherein the plurality of flexible films are not bonded to the heat dissipation unit.

8. The display device of claim 2, wherein the elastic member has an elastic force pushing the heat dissipation member toward the cover bottom and the display panel.

9. The display device of claim 2, wherein:
the heat dissipation member is formed of one of graphite, aluminum (Al), and copper (Cu); and
the elastic member is formed of a foam tape.

10. The display device of claim 1, wherein the heat dissipation unit extends in a direction corresponding to a length direction of the printed circuit board.

11. The display device of claim 1, further comprising:
a cover shield covering the printed circuit board and in contact with a rear surface of the cover bottom.

12. The display device of claim 11, wherein the heat dissipation unit at least partially overlaps the cover shield.

13. The display device of claim 11, wherein:
the cover bottom further includes a first protrusion along an edge of the first opening and protruding away from the display panel; and
the cover shield includes a bent edge engaged with the first protrusion of the cover bottom.

14. The display device of claim 1, wherein:
the plate bottom includes a portion protruding away from the rear surface of the display panel; and
the printed circuit board is disposed on the portion of the plate bottom protruding away from the rear surface of the display panel.

15. A display device, comprising:
a display panel;
a cover bottom on a rear surface of the display panel and including a first opening;
a plurality of flexible films, each passing through the first opening and having one end connected to the display panel; and
a heat dissipation unit disposed between the display panel and the cover bottom,
wherein a front surface of the heat dissipation unit is in contact with a rear surface of the one end of at least one of the plurality of flexible films.

16. The display device of claim 15, wherein the heat dissipation unit includes an elastic member and a heat dissipation member enclosing the elastic member.

17. The display device of claim 16, further comprising:

a first member bonding the heat dissipation unit to the cover bottom; and a second member bonding the heat dissipation unit to the display panel.

18. The display device of claim 17, wherein:

the first member overlaps the heat dissipation unit in a plan view; and the second member is spaced apart from the plurality of flexible films and overlaps a part of the heat dissipation unit in the plan view.

19. The display device of claim 18, wherein:

each of the plurality of flexible films further includes another end connected to a printed circuit board; and the plurality of flexible films are closer to a center portion of the display panel than the second member is in the plan view.

20. The display device of claim 18, wherein the plurality of flexible films are not bonded to the heat dissipation unit.

* * * * *